Figure 1:
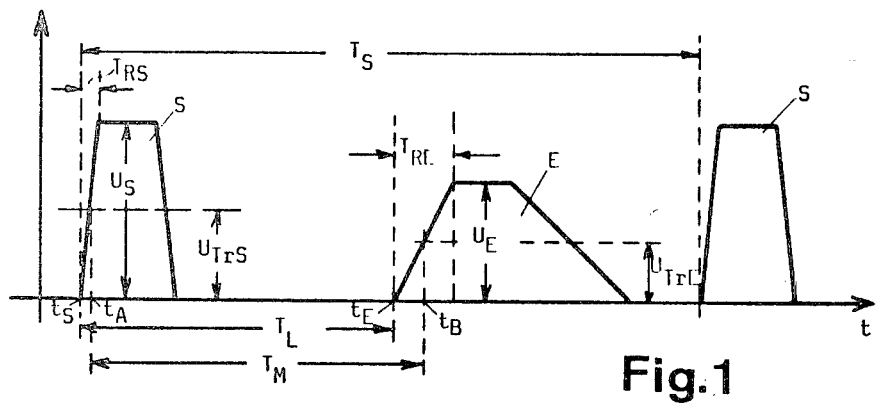

United States Patent [19]

Sartorius

[11] 4,322,832
[45] Mar. 30, 1982

[54] METHOD AND ARRANGEMENT FOR PULSE SPACING MEASUREMENT

[75] Inventor: Wilfried Sartorius, Steinen, Fed. Rep. of Germany

[73] Assignee: Endress u. Hauser GmbH u. Co., Maulburg, Fed. Rep. of Germany

[21] Appl. No.: 158,444

[22] Filed: Jun. 11, 1980

[30] Foreign Application Priority Data

Jul. 13, 1979 [DE] Fed. Rep. of Germany ....... 2923963

[51] Int. Cl.³ .................. G04C 11/02; G04F 8/00; G01S 13/00
[52] U.S. Cl. ................................. 368/47; 368/113; 343/7 R
[58] Field of Search .................. 368/113–121, 368/46, 47; 328/129–131; 343/7 R, 112 S

[56] References Cited

U.S. PATENT DOCUMENTS

4,000,466 12/1976 Scouten et al. ............ 343/112 S X
4,077,011 2/1978 Mathis ........................ 368/113
4,090,141 5/1978 Leblanc ...................... 368/113 X Primary Examiner—Vit W. Miska
Attorney, Agent, or Firm—Gerald J. Ferguson, Jr.; Joseph J. Baker; C. Lamont Whitham

[57] ABSTRACT

Method and apparatus for pulse spacing measurement with periodic pulse pairs, in particular in pulse radar, by measuring the time interval between the instants of the coincidence of a pulse edge with a trigger level which is set in a predetermined ratio to the peak value of the pulse, characterized in that the pulse pairs are sampled by the sampling method with the aid of sampling pulses whose recurrence period is smaller by a predetermined small time difference than the recurrence period of the pulse pairs, that for each time-transformed pulse obtained by the sampling the peak value is determined and a trigger level having a predetermined ratio to the peak value is set, and that the time interval between the instants of the coincidence of the trailing pulse edge of each time-transformed pulse and the associated trigger level is measured.

13 Claims, 18 Drawing Figures

METHOD AND ARRANGEMENT FOR PULSE SPACING MEASUREMENT

The invention relates to a method and arrangement for pulse spacing measurement with periodic pulse pairs, in particular in pulse radar, by measuring the time interval between the instants of the coincidence of a pulse edge with a trigger level which is set in a predetermined ratio to the peak value of the pulse.

In the measurement of the interval between the two pulses of successive pulse pairs measurement errors can occur when the amplitudes of the pulses are subjected to fluctuations. This is particularly the case in range measurement using the pulse radar principle in which the interval between each of the periodically transmitted pulses and the received pulse obtained from an echo reflected at the target is measured as an indication of the range of the target. For the amplitude of the received pulses can be subjected to large and rapid fluctuations due to varying reflection and propagation conditions. The measurement errors then arise because the pulses have a finite rise time and the circuits used for the pulse spacing measurement have a response threshold differing from zero. If the coincidence of the rising pulse edges with a fixedly set trigger level is used for the time measurement, the coincidence instants are displaced in dependence upon the pulse amplitude because the rise time of the pulse edges, which is defined in particular by the band width of the circuits used, is constant independently of the pulse amplitude.

It is known to reduce the measurement errors caused by fluctuating pulse amplitudes by not holding the trigger level constant but adjusting it in dependence upon the pulse amplitude. Since however the amplitude of a pulse is not known until the end of the leading edge, in the course of which the coincidence must be determined, the trigger level for each pulse can only be set on the basis of the amplitude of one or more preceding pulses. Thus, when using this technique measurement errors can still occur when the pulse amplitude between two successive pulses varies greatly; the measurement may not even take place if the amplitude of a pulse is smaller than the trigger level set on the basis of the amplitude of the preceding pulse.

In certain applications, for example in the measurement of short distances with an infrared pulse radar, the time intervals to be measured between the pulses and the necessary measurement accuracies are in the nano and subnano second region. Since to measure such short times very rapid circuits of high band width are required, it is known in periodic operations to conduct the measurement not on the real time signals but on time-transformed signals obtained with the aid of the "sampling method". The known sampling method resides in obtaining from each of the successive pulse periods a sample value, the time location of the sample values being slightly displaced with respect to the start of each pulse period from period to period. This sampling is controlled by sampling pulses whose period is greater by a fixed very small time difference than the pulse periods to be sampled. Each sample value is stored until the next sampling. The successive sample values thus give a picture of the sampled pulse periods but to a time scale expanded by a time transformation factor. This is thus a sort of electronic stroboscopic sampling.

The pulse spacing measurement can be conducted on the time-transformed pulses obtained by the sampling method in the same manner as on the real time pulses i.e. by establishing the coincidence of the rising pulse edges with a trigger level which can possibly be set on the basis of the amplitude of a preceding time-transformed pulse. Of course, the measured time intervals are magnified by the time transformation factor.

However, as regards the effects of fluctuations of the pulse amplitudes on the measurement accuracy outlined above the sampling method has no advantage. Since the intervals between the time-transformed pulses used for the measurement are several times greater than the intervals between the real time pulses, the probability of the pulse amplitude between two successive measurement cycles undergoing pronounced variation is very much greater.

The problem underlying the invention is to provide a method with which the intervals between the pulses of periodic pulse pairs can be measured utilising the advantages of the sampling method without impairing the measurement accuracy by fluctuations of the pulse amplitudes.

Proceeding from a method of the type outlined at the beginning this problem is solved by the invention in that the pulse pairs are sampled by the sampling method with the aid of sampling pulses whose recurrence period is smaller by a predetermined small time difference than the recurrence period of the pulse pairs, that for each time-transformed pulse obtained by the sampling the peak value is determined and a trigger level having a predetermined ratio to the peak value is set, and that the time interval between the instants of the coincidence of the trailing pulse edge of each time-transformed pulse and the associated trigger level is measured.

In the method according to the invention a modification of the usual sampling method is used which results in a time-reversed sampling. This means that the time-transformed pulse period obtained by the sampling, although an accurate image of the real time periods, has the reversed time location. Thus, each time-transformed pulse has the reversed time variation of the real time pulses and consequently its leading edge corresponds to the trailing edges of the real time pulses and its trailing edge to the leading edges of the real time pulses. Furthermore, the mutual time location of the time-transformed pulses within the pulse period is reversed; thus, in a radar system the time-transformed received pulse appears before the time-transformed transmitted pulse. Since however with the method according to the invention the time interval between the trailing edges of the time-transformed pulses is measured and these correspond to the leading edges of the real time pulses, the correct time-transformed measuring time is obtained.

The essential advantage of the time inversion in the time-transformed range resides in that the amplitude of each time-transformed pulse is available before that trailing edge used for the measurement. The trigger level used for the measurement can thus be adjusted on the basis of the amplitude of the same pulse. Thus, different pulse amplitudes of successive time-transformed pulses have no effect on the measurement accuracy.

Furthermore, the invention provides arrangements for carrying out the method thereof which are distinguished in particular by a simple construction.

Figure 2:
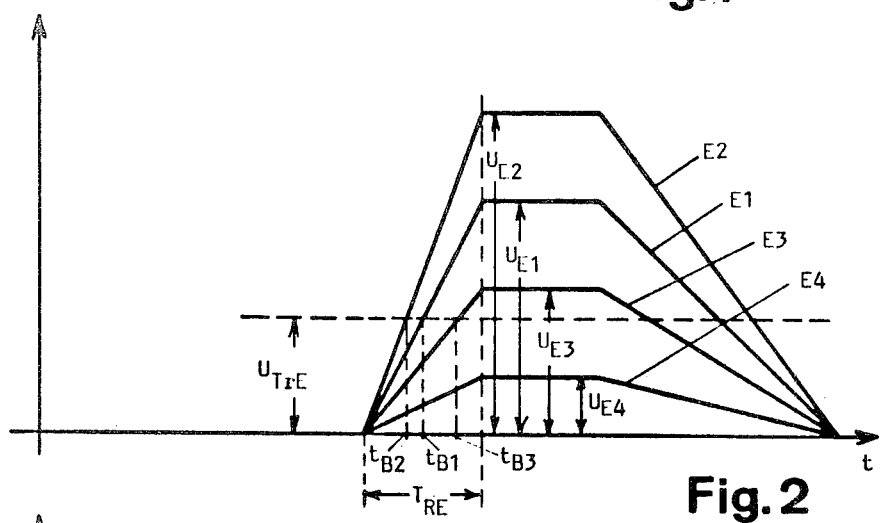
Figure 3:
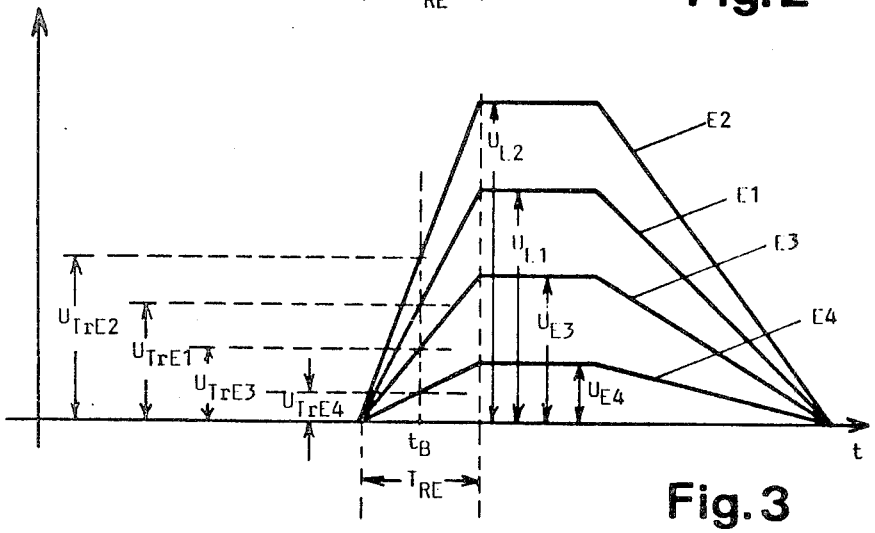
Figure 4:
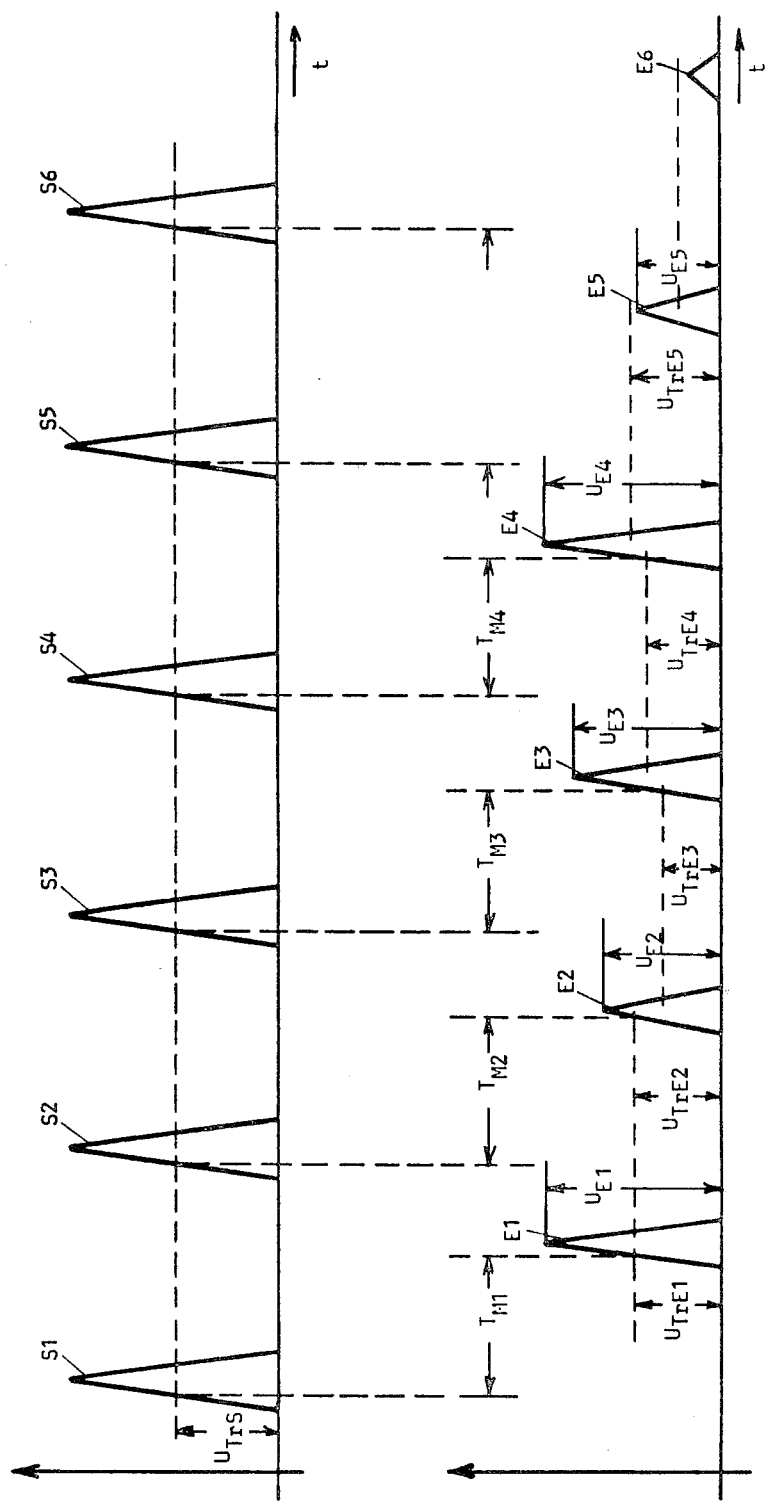
Figure 5:
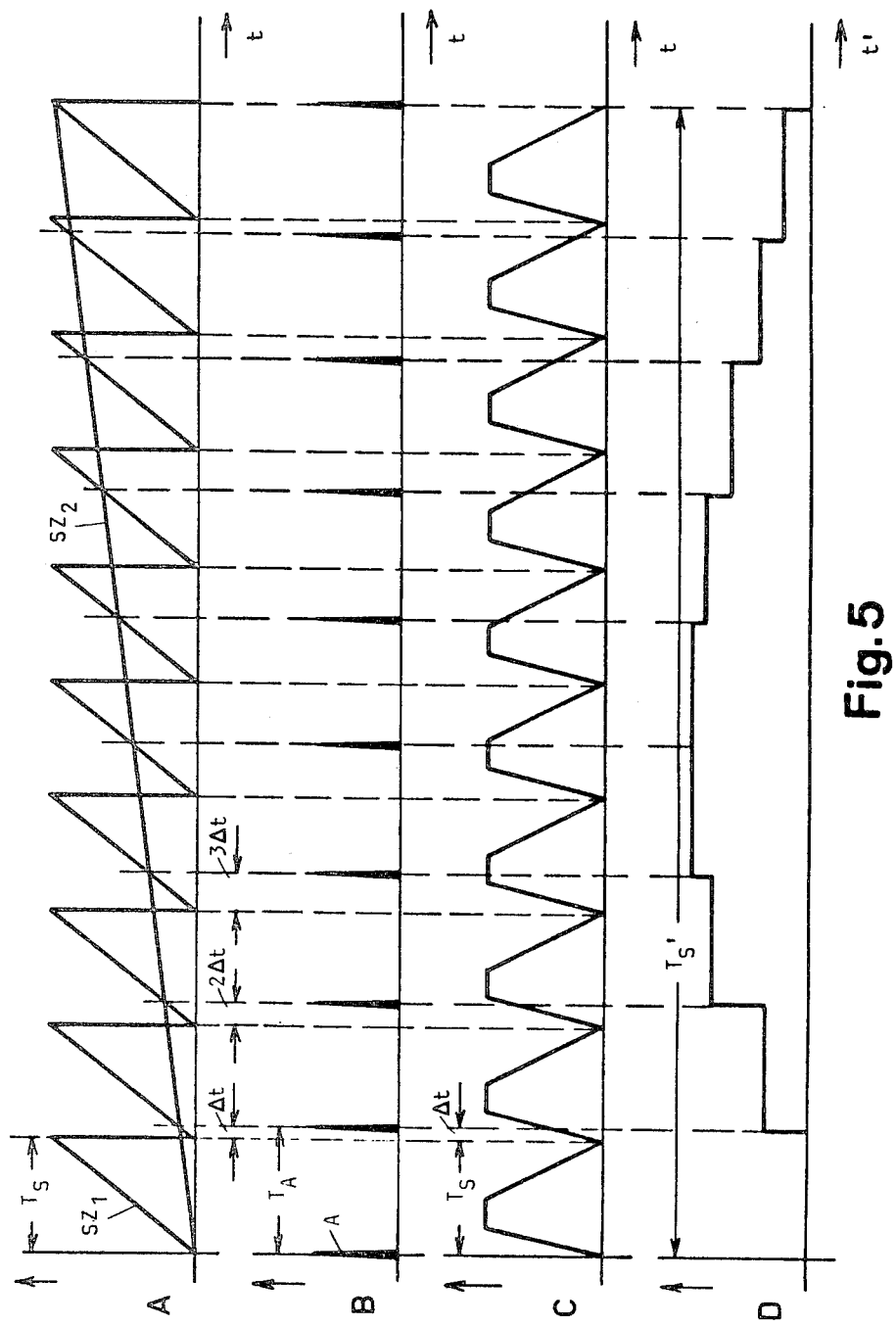
Figure 6:
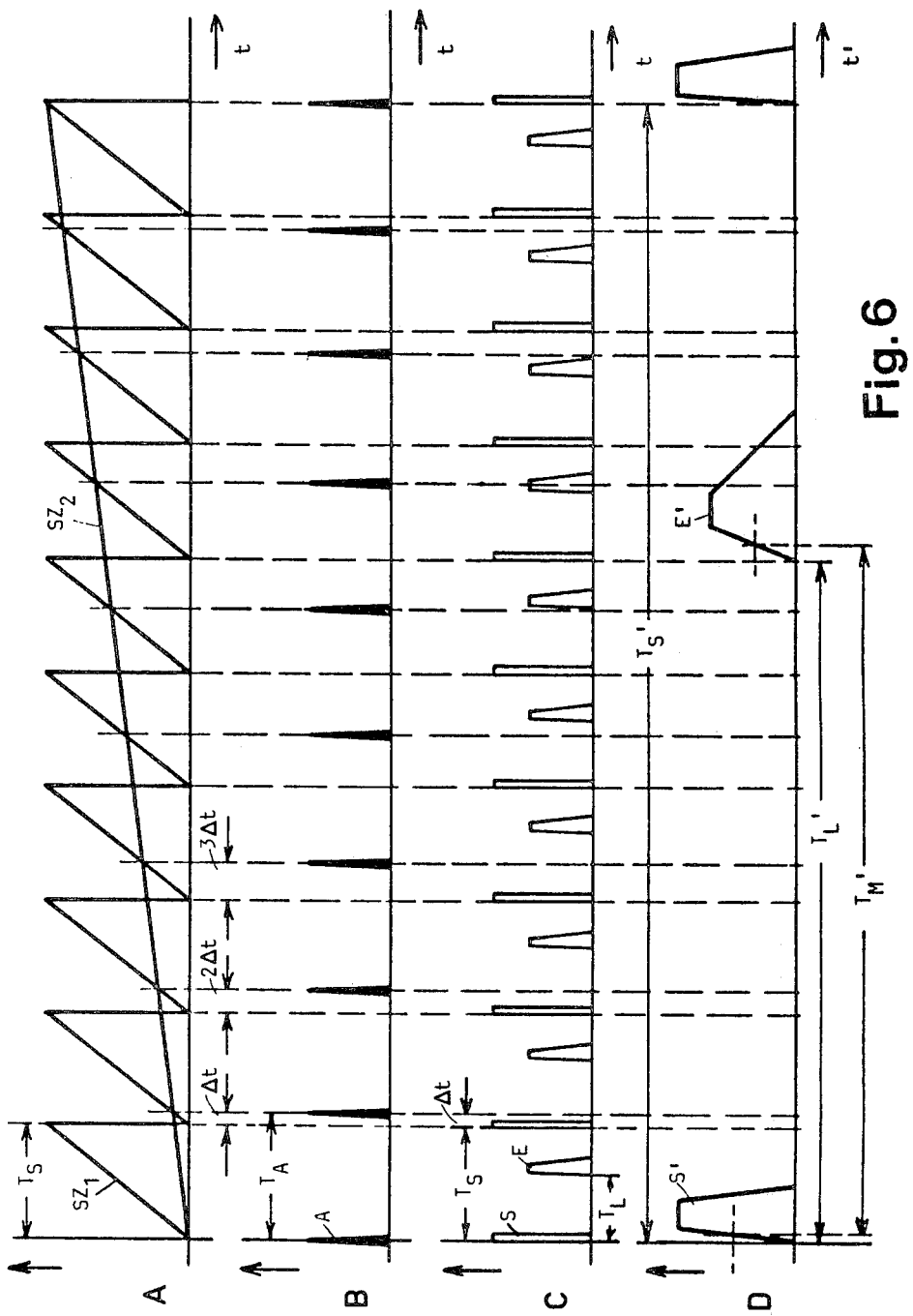
Figure 7:
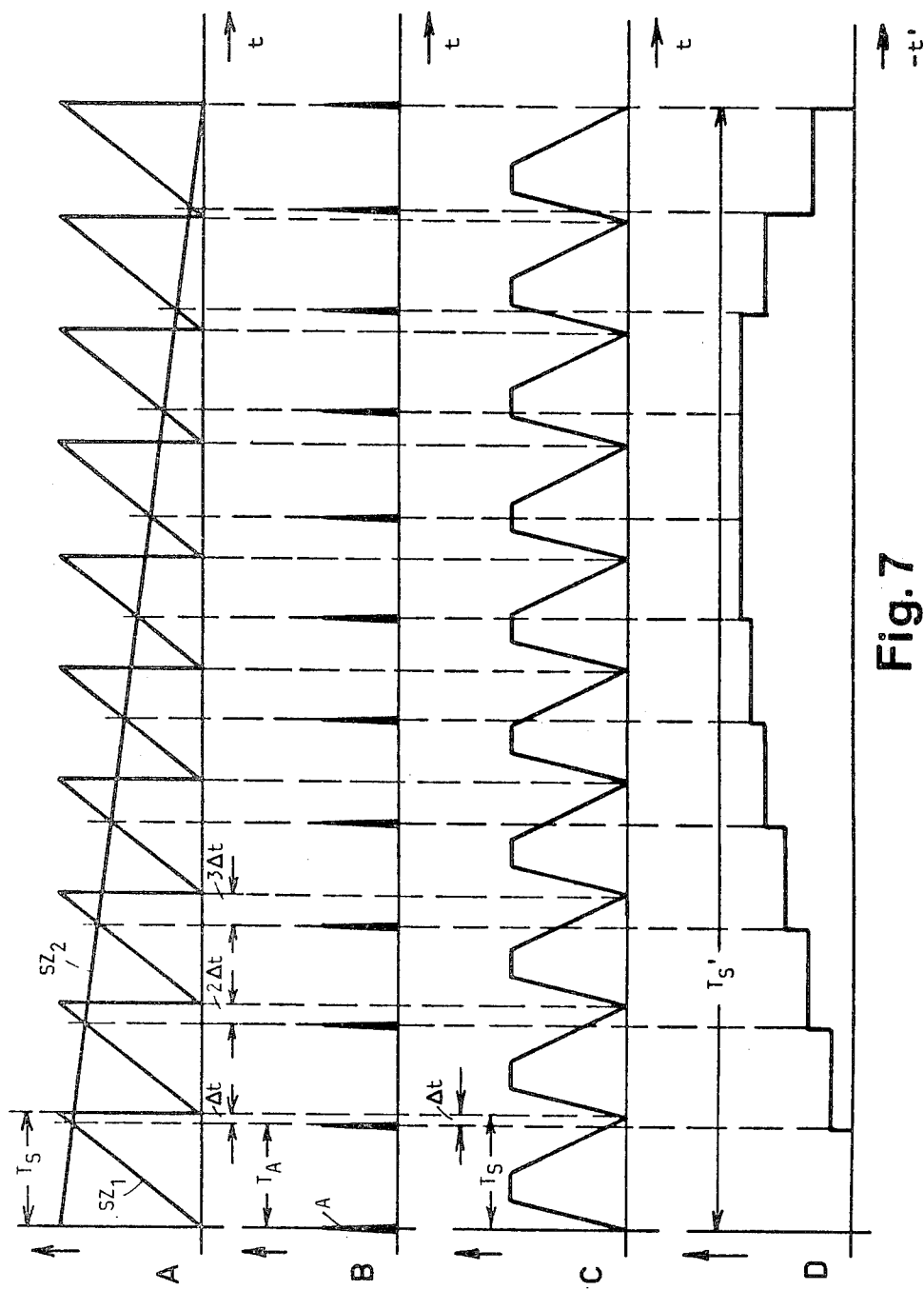
Figure 8:
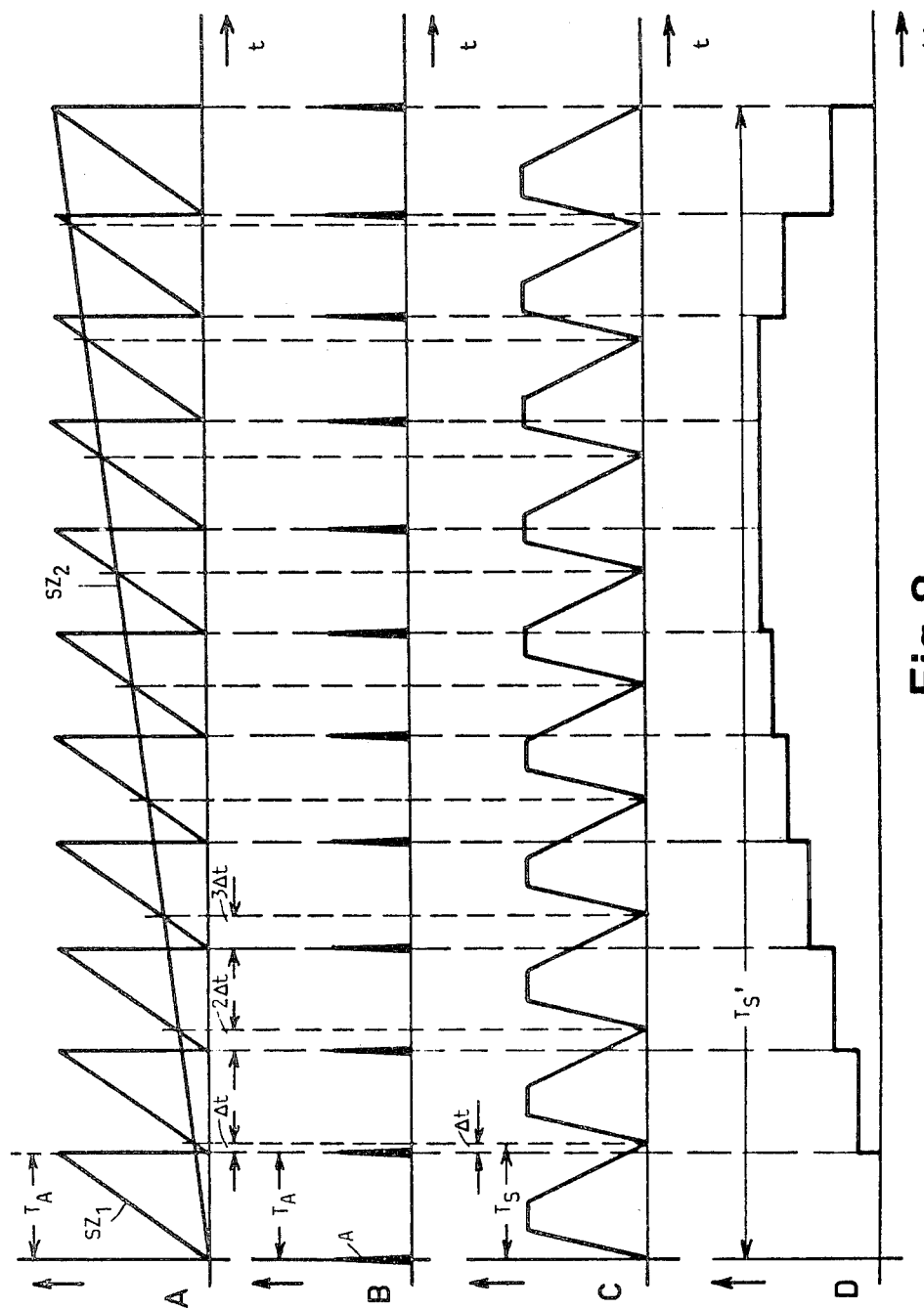
Figure 9:
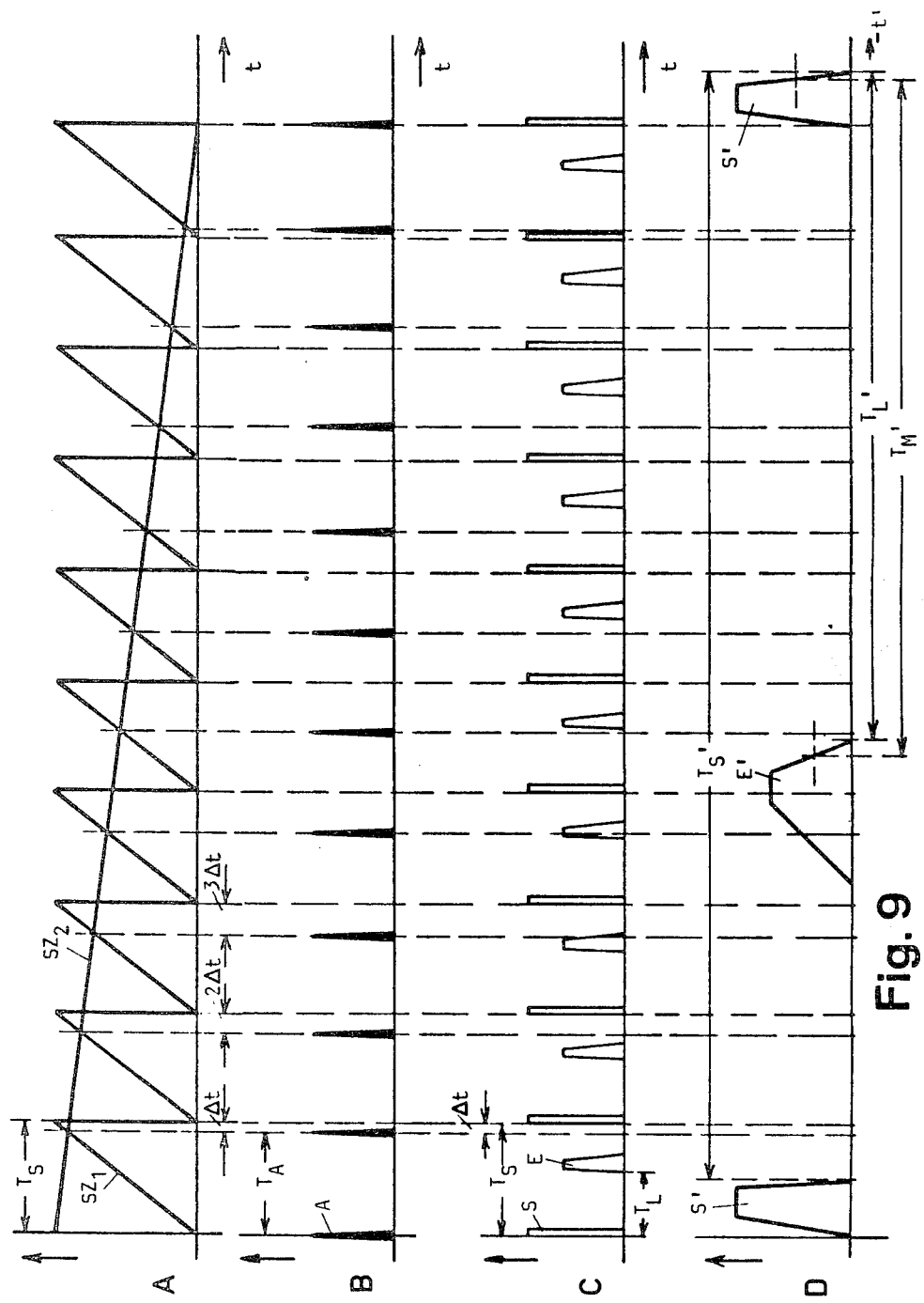
Figure 10:
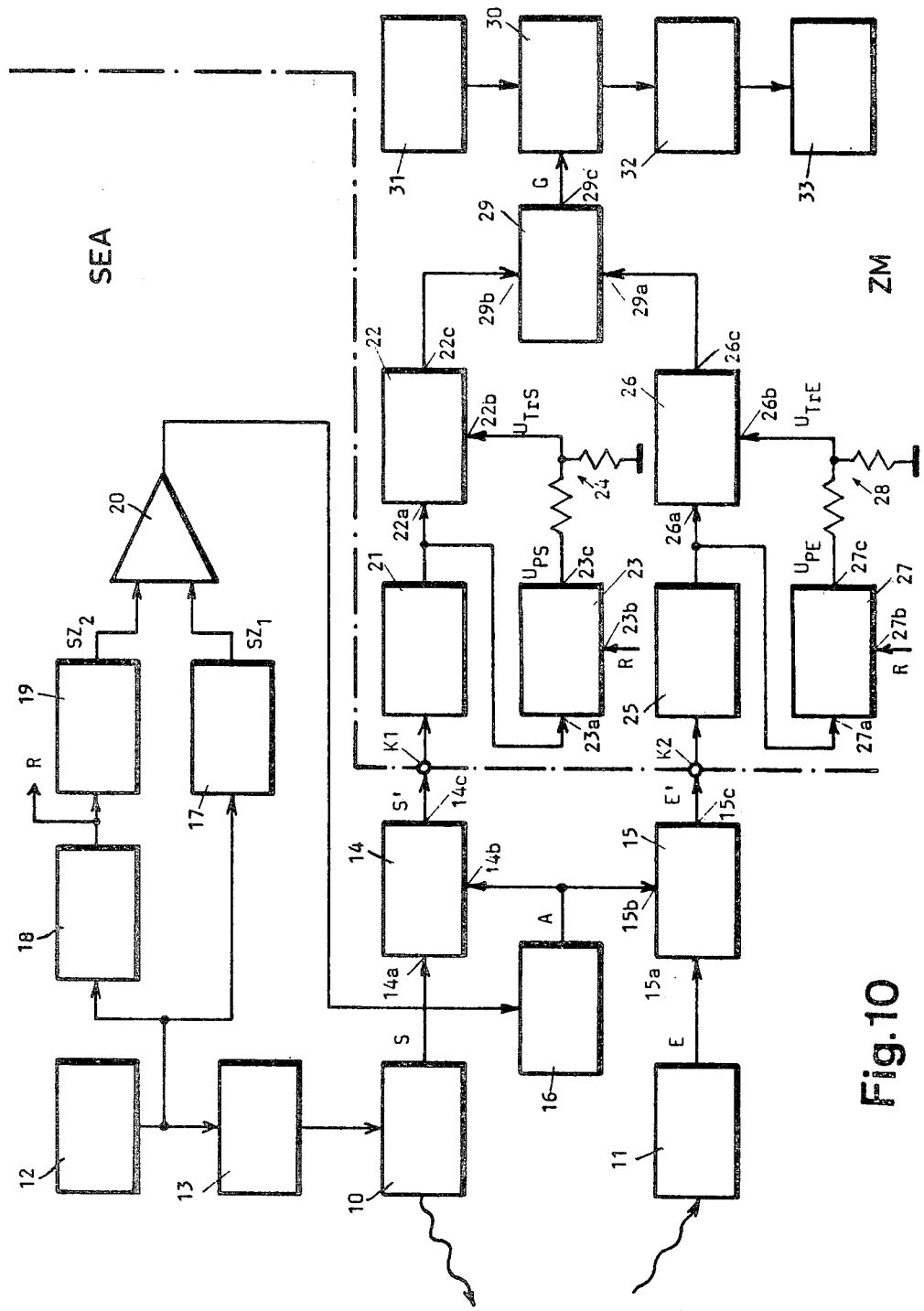
Figure 11:
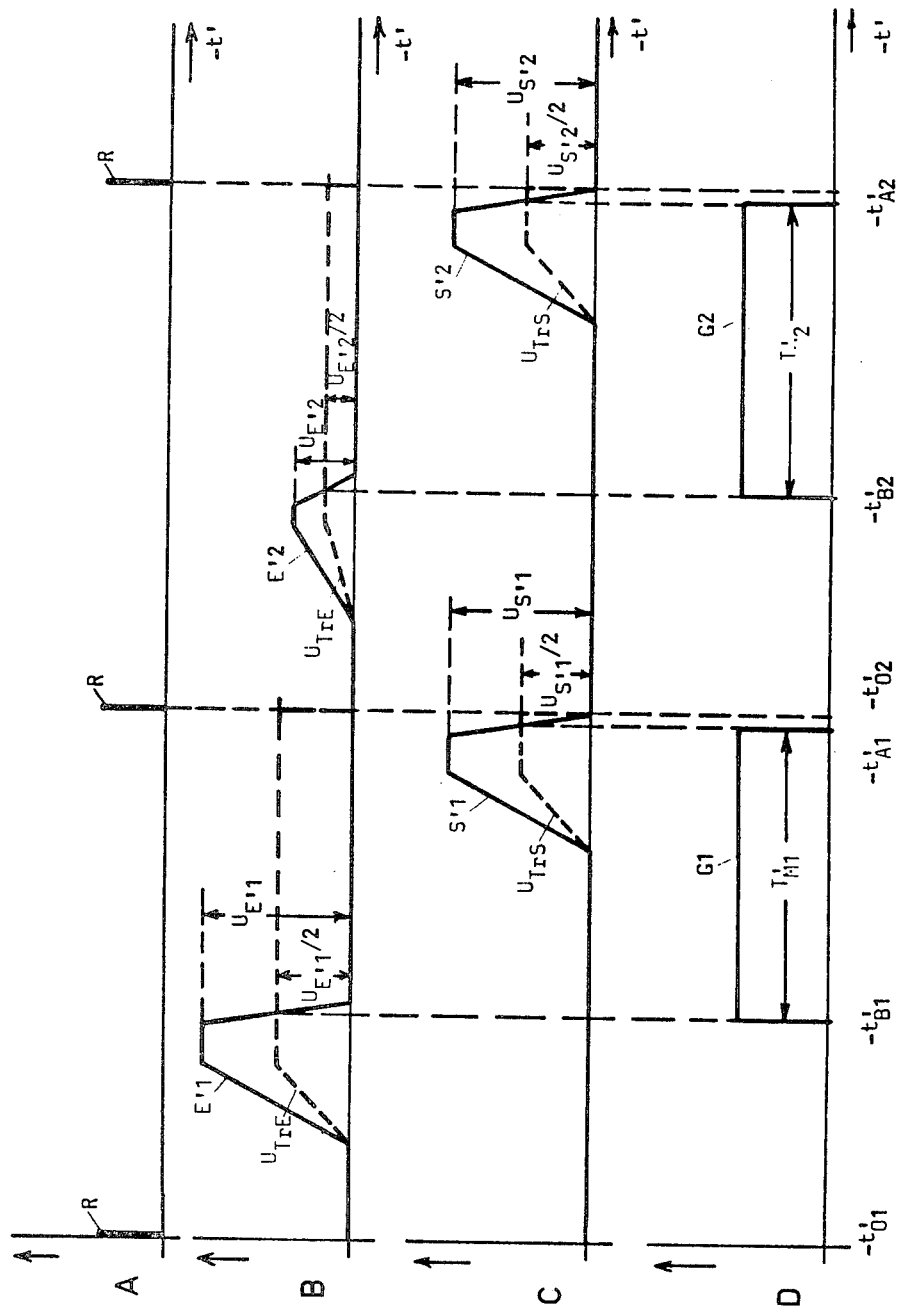
Figure 12:
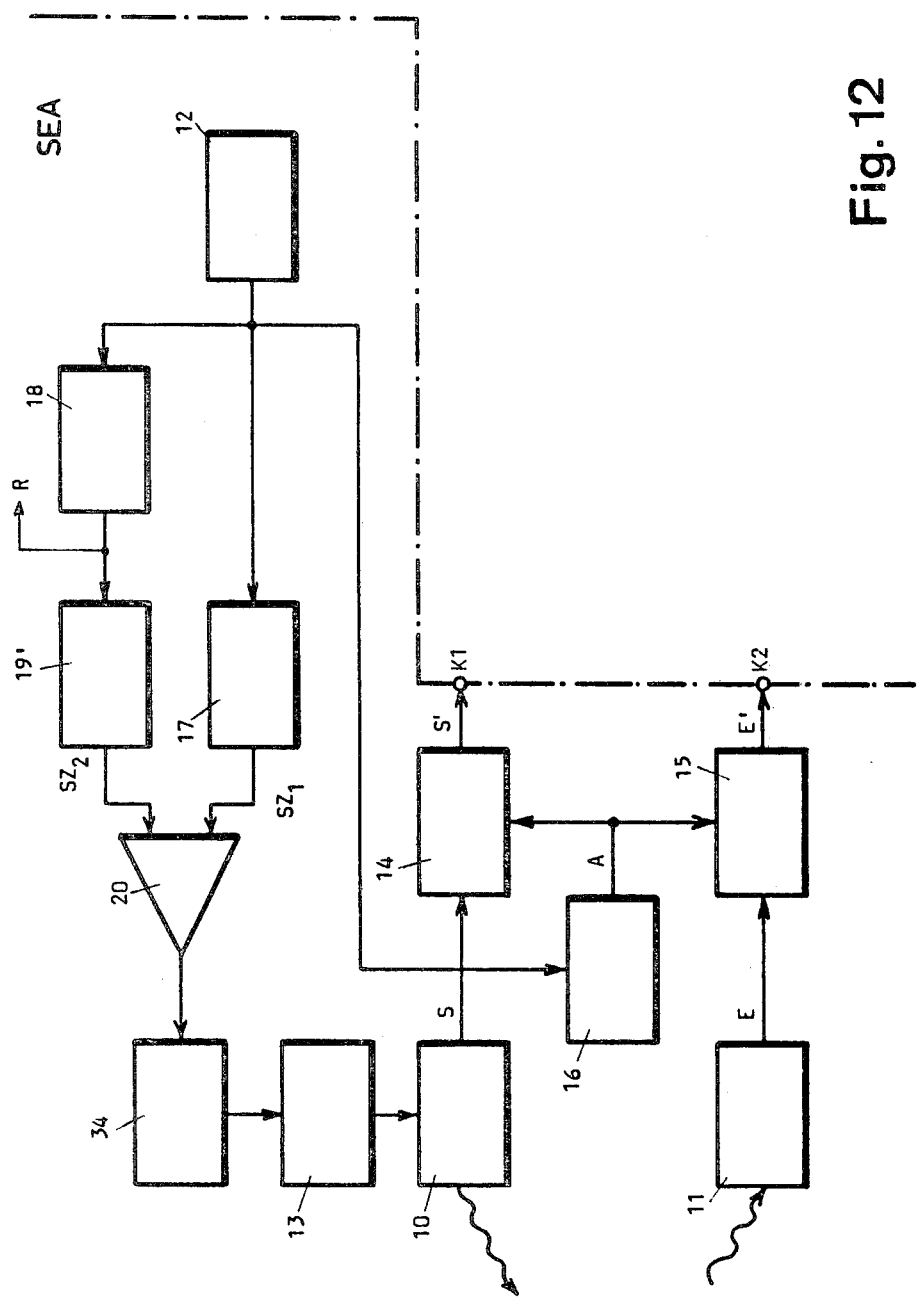
Figure 13:
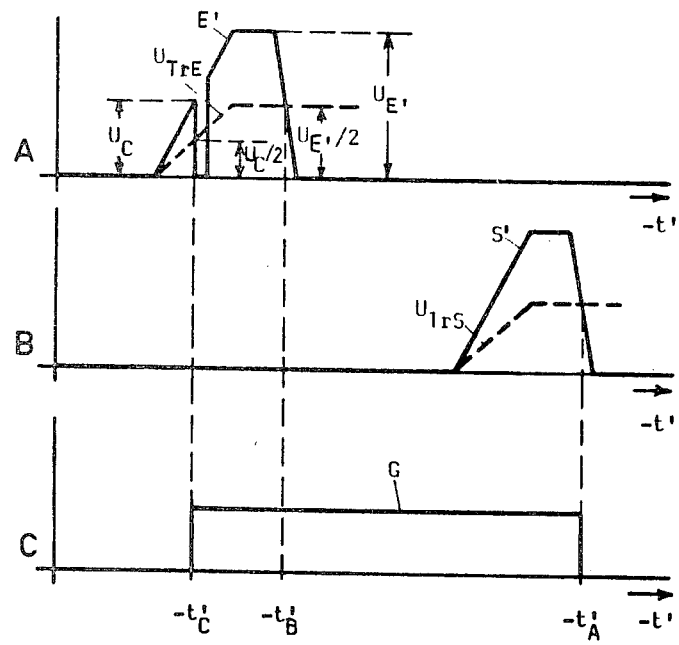
Figure 14:
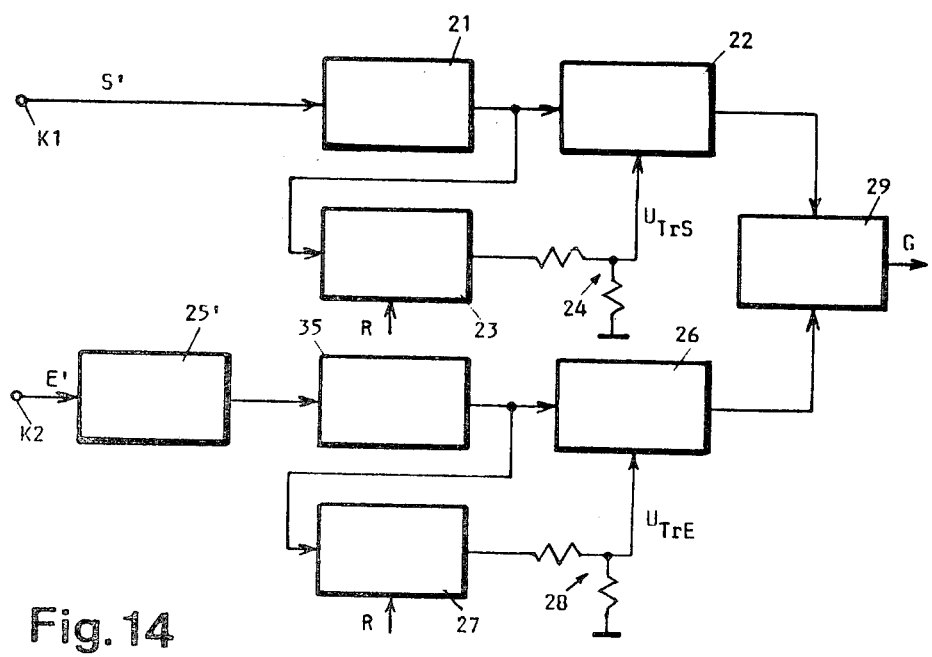
Figure 15:
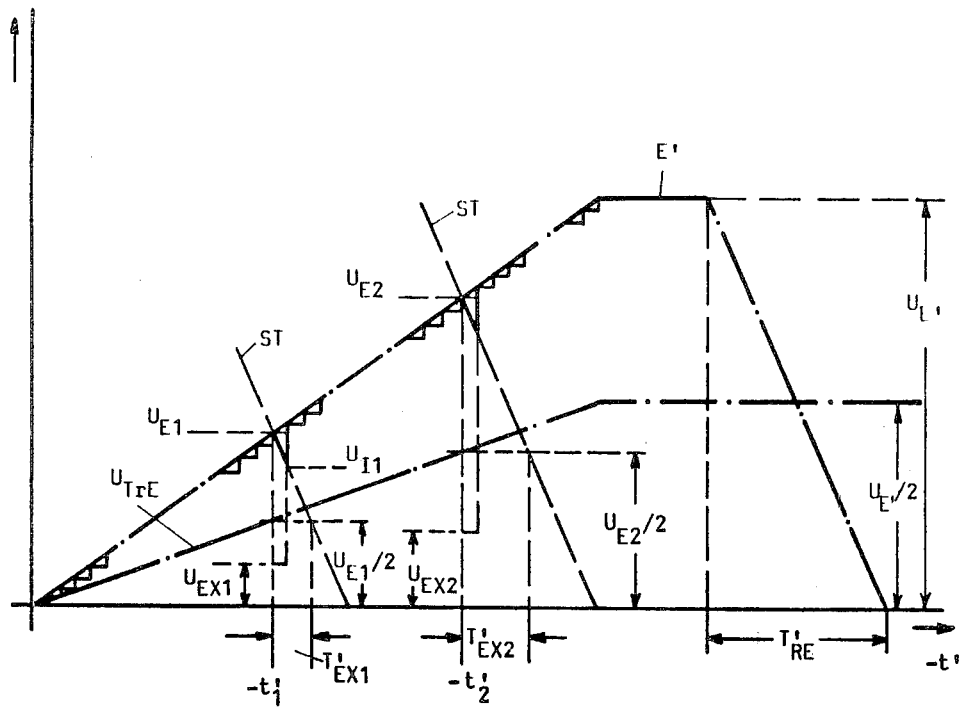
Figure 16:
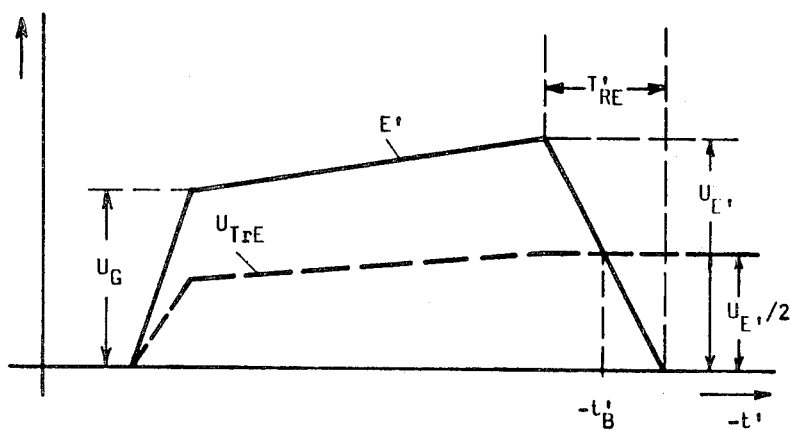
Figure 17:
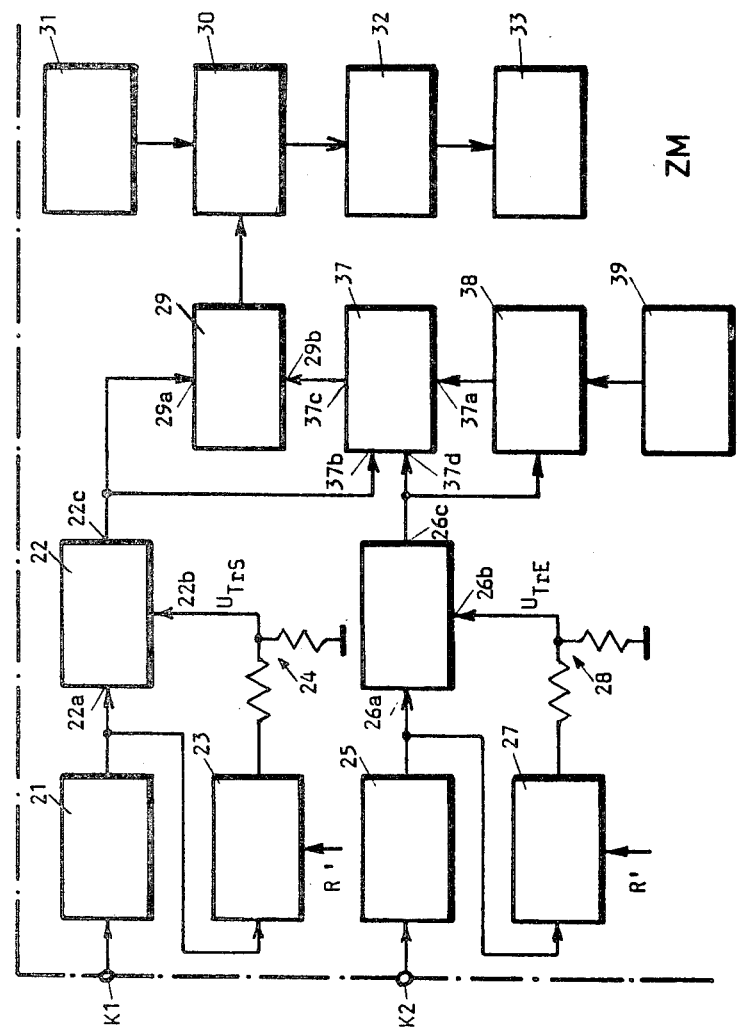
Figure 18:
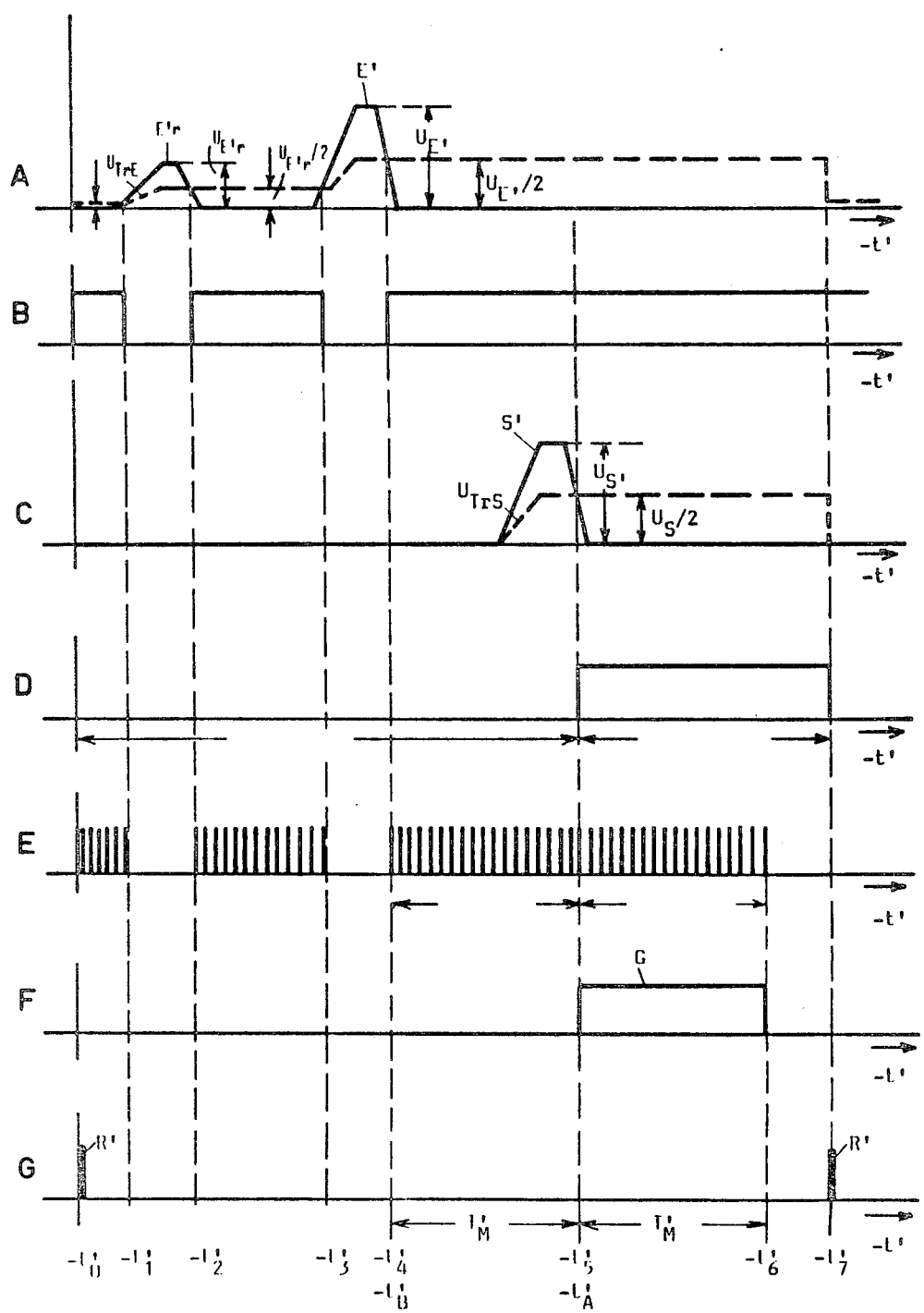

Further features and advantages of the invention will be apparent from the description of the examples of embodiment with the aid of the drawings, wherein:

FIG. 1 is a diagram explaining the pulse spacing measurement in a pulse radar system, FIG. 2 is a diagram explaining the effects of pulse amplitude fluctuations on the measurement accuracy, FIG. 3 is a diagram explaining a known step for obviating the phenomenon illustrated in FIG. 2, FIG. 4 is a diagram explaining the effects of rapid amplitude fluctuations in the usual use of the step illustrated in FIG. 3, FIG. 5 shows diagrams explaining the usual sampling method, FIG. 6 shows diagrams explaining the use of the usual sampling method in pulse spacing measurement, FIG. 7 shows diagrams explaining the time-reversed sampling method used in the invention, FIG. 8 shows diagrams similar to FIG. 7 explaining a different type of production of the sampling pulses for the time-reversed sampling method, FIG. 9 shows diagrams explaining the use of the time-reversed sampling method in pulse spacing measurement, FIG. 10 is a block circuit diagram of an arrangement for carrying out the method explained with the aid of FIG. 9, FIG. 11 shows diagrams explaining the mode of function of the arrangement of FIG. 10, FIG. 12 is a modification of part of the arrangement of FIG. 10 for carrying out the production of the sampling pulses explained with the aid of FIG. 8, FIG. 13 shows diagrams explaining the effects of the absence of pulses, FIG. 14 is a modification of part of the arrangement of FIG. 10 with which the phenomenon outlined with reference to FIG. 13 can be obviated, FIG. 15 is a diagram explaining the effect of the integrating circuit in the arrangement of FIG. 14, FIG. 16 is a diagram explaining the effect of the dynamic compressor in the arrangement of FIG. 14, FIG. 17 is a block circuit diagram of a modified embodiment of part of the arrangement of FIG. 10 in which rereflections are suppressed and FIG. 18 shows diagrams explaining the mode of function of the arrangement of FIG. 17.

To facilitate understanding of the invention, firstly the measuring principle used for pulse spacing measurement will be explained with the aid of FIGS. 1, 2 and 3.

As example, it is assumed that the measurement involved is that of the interval between the transmitted pulses and received pulses in range measurement on the pulse radar principle. The waves used may be of any desired type (high-frequency waves, light waves, ultrasonic waves). The problem of measuring very small time intervals and differences—in the nano and subnano second range—occurs primarily with radar range measurement by means of light pulses. For this reason the invention will be explained with reference to the example of the known infrared pulse radar.

An infrared source (e.g. an infrared solid state laser) emits periodically light pulses which when they impinge on an obstacle (target) are partially absorbed and partially reflected. From the travel time between the transmitted pulse and reflected received pulse the distance D between transmitter and target is calculated according to the following simplified formula:

$$D = \tfrac{1}{2} \cdot c \cdot T_L \quad (1)$$

In this formula, c is the velocity of light, $T_L$ the travel time between the transmission of the transmitted pulse and the receipt of the reflected received pulse. The factor $\tfrac{1}{2}$ results because the light pulse must cover the distance between transmitter and target twice.

FIG. 1 shows two of the periodically transmitted pulses S and the received pulse E received on the basis of the first transmitted pulse. The transmission period $T_S$ between successive transmitted pulses must be so large that for the maximum range occurring the received pulse E must arrive before transmission of the next transmitted pulse.

The transmission of the pulse S starts at the instant $t_S$ and the receipt of the incoming pulse starts at the instant $t_E$. The interval between the instants $t_S$ and $t_E$ is the actual pulse travel time $T_L$ which corresponds exactly to the range to be measured.

The time $T_M$ measured in reality does not coincide with the real travel time $T_L$ because the circuits used for the measurement have a response threshold differing from zero and the rise time of the pulses S and E used for the time measurement also differs from zero.

Since the time measurement is made at the location of the transmitter, it may be assumed that the transmitted pulses S initiating the start of the time measurement have a constant amplitude $U_S$. The rise time $T_{RS}$ of the transmitted pulses may be kept relatively short. If therefore a constant trigger level $U_{TrS}$ is fixed for the start of the time measurement, said level being for example equal to half the amplitude $U_S$ of the transmitted pulses, the time measurement starts at an instant $t_A$ which lies at a known always constant time interval after the instant $t_S$ of the start of the transmission of the transmitted pulse S.

In contrast, the amplitude $U_E$ of the received pulses E is subjected to pronounced fluctuations which are caused by variation of the absorption and dispersion at the target, fluctuations of the properties of the propagation medium and other influences. Furthermore, the amplitude of the received pulses is very small and for this reason for evaluation they must first be amplified in the receiving electronic system to an adequate value. The rise time $T_{RE}$ of the received pulses E, due to the band width of the receiving electronic system, is greater than the rise time $T_{RS}$ of the transmitted pulses. The rise time limited by the band width is given approximately by the following formula:

$$T_R \approx 350/B \quad (2)$$

In this formula, $T_R$ is the rise time in nanoseconds and B the band width in Megahertz. For a given band width of the receiving electronic system of 100 MHz formula (2) thus gives an inherent rise time $T_{RI}$ of the receiving electronic system of about 3.5 ns. To this is added the actual rise time of the received pulse, which can be assumed substantially equal to the rise time $T_{RS}$ of the transmitted pulse. The total rise time $T_{RE}$ of the received pulse is thus obtained from the following formula:

$$T_{RE} = \sqrt{T_{RI}^2 + T_{RS}^2} \quad (3)$$

Thus, for a rise time of $T_{RS}$ of the transmitted pulses S of 1 ns and the band width previously assumed of the receiving electronic system of 100 MHz formula (3) gives a rise time $T_{RE}$ of the received pulses E of about 3.64 ns.

The termination of the measuring time $T_M$ is at an instant $t_B$ at which the rising edge of the suitably amplified received pulse E reaches a trigger level $U_{TrE}$. The instant $t_B$ is at an interval after the instant $t_E$ which is generally different from the interval between the instants $t_S$ and $t_A$ at the start of the measuring time. Consequently, the measuring time $T_M$ is generally different from the real travel time $T_L$ of the pulses. This difference has no influence on the measuring accuracy as long as the intervals $t_S$-$t_A$ and $t_E$-$t_B$ remain constant; in this case the difference $T_M$-$T_L$ is also constant and can be taken into account in the calculation of the range.

As already mentioned, it may be assumed that the interval $t_S$-$t_A$ is always constant at the start of the measurement. On the other hand, at the end of the time measurement due to the amplitude fluctuations of the received pulses E variations of the interval $t_E$-$t_B$ occur if a constant trigger level $U_{TrE}$ is used. This will be explained with the aid of FIG. 2.

FIG. 2 shows four different received pulses E1, E2, E3, E4 which are received with different amplitudes $U_{E1}$, $U_{E2}$, $U_{E3}$, $U_{E4}$ but which all have the same rise time $T_{RE}$. The received pulse E1 corresponds to the received pulse E of FIG. 1 to a somewhat greater scale. The rising edge of the pulse E1 intersects the line representing the trigger level $U_{TrE}$ at the instant $t_{B1}$. It is assumed as example that the trigger level $U_{TrE}$ is half the amplitude $U_{E1}$ of the received pulse E1.

If the trigger level $U_{TrE}$ is kept constant and the received pulse E2 is received with a greater amplitude $U_{E2}$ the coincidence of the rising edge with the trigger level occurs at an instant $t_{B2}$ which lies before the instant $t_{B1}$. The measuring time $T_M$ is then correspondingly shorter and an error occurs in the range measured, the result being too short.

Conversely, with the received pulse E3, whose amplitude $U_{E3}$ is smaller than the amplitude of the received pulse E1 but greater than the trigger level, the coincidence instant $t_{B3}$ is after the instant $t_{B1}$ so that the measuring time $T_M$ is correspondingly increased and an error again occurs in the range measurement, the result being in this case too large.

Finally, if a pulse E4 is received whose amplitude $U_{E4}$ is smaller than the trigger level no initiation of the completion of the measuring time at all occurs and no useful result is obtained.

It is known to avoid the measurement errors explained with the aid of FIG. 2 due to the amplitude fluctuations of the received pulses by not keeping the trigger level $U_{TrE}$ constant but varying it in dependence upon the amplitude of the received pulses. This will be explained with the aid of FIG. 3.

FIG. 3 again shows the four received pulses E1, E2, E3, E4 of FIG. 2 with the amplitudes $U_{E1}$, $U_{E2}$, $U_{E3}$, $U_{E4}$ and the same rise time $T_{RE}$. Furthermore, the trigger level $U_{TrE1}$ is illustrated which corresponds to half the amplitude $U_{E1}$ of the received pulse E1 and thus corresponds to the trigger level $U_{TrE}$ of FIG. 2. On receipt of the pulse E1 coincidence thus occurs at an instant $t_B$ which corresponds to the instant $t_{B1}$ of FIG. 2. If on receipt of the pulse E2 for terminating the time measurement the trigger level $U_{TrE1}$ is not used but a trigger level $U_{TrE2}$ which is equal to half the amplitude $U_{E2}$ of the received pulse E2, this trigger level will again be intersected by the rising edge of the pulse E2 at the instant $t_B$. Thus, in spite of the different amplitude on receipt of the pulses E1 and E2 the same measurement time $T_M$ is obtained.

The same applies to the received pulses E3 and E4 if in each case a trigger level $U_{TrE3}$ and $U_{TrE4}$ is used which is half the amplitude $U_{E3}$ and $U_{E4}$ respectively of these pulses. In all cases the coincidence occurs at the same instant $t_B$. Moreover, a measurement value is obtained even for pulses of small amplitude, such as for the pulse E4.

It is pointed out that this result is obtained not only when the trigger level used is equal to half the pulse amplitude but also when the trigger level is kept at another constant ratio to the pulse amplitude. For simplification, in the following description it will be assumed that a trigger level is used which is half the pulse amplitude.

The application of the principle illustrated in FIG. 3 requires that the trigger level is set during the rising flank, i.e. before the amplitude of the received pulse is known. In practice, use is made of the fact that the measurements occur periodically and the trigger level for the next received pulse is set in dependence upon the amplitude of the preceding received pulse. This solution is acceptable when the received pulse amplitudes vary only slowly. For large rapid fluctuations of the amplitudes of the received pulses, however, measurement errors can again occur or the measurements may not take place at all, as will be explained with the aid of FIG. 4.

In the upper part of FIG. 4 a train of six transmitted pulses S1, S2, S3, S4, S5, S6 is illustrated and in the lower part of FIG. 4 the corresponding received pulses E1, E2, E3, E4, E5, E6 obtained by reflection at the same target are shown. The amplitude of the transmitted pulses is constant and the initiation of the time measurement occurs in each transmitted pulse period with the aid of the same constant trigger level $U_{TrS}$. On the other hand, it is assumed that the amplitude of the received pulses varies greatly from pulse to pulse and that the trigger level for each received pulse is set to half the amplitude of the preceding received pulse.

If it is assumed that the trigger level $U_{TrE1}$ of the first received pulse E1 is equal to half the amplitude $U_{E1}$ of said received pulse because the preceding received pulse, not illustrated in FIG. 4, had the same amplitude, a measurement time $T_{M1}$ is obtained which may be assumed to be the correct time.

For the pulse E2 a trigger level $U_{TrE2}$ is set which is half the pulse amplitude $U_{E1}$. If, as illustrated, the amplitude $U_{E2}$ of the pulse E2 is substantially smaller than the amplitude $U_{E1}$ of the pulse E1, for constant range a measurement time $T_{M2}$ is obtained which is greater than the measurement time $T_{M1}$ and consequently eroneous.

The trigger level $U_{TrE3}$ for the pulse E3 is set to half the amplitude $U_{E2}$. Since however the amplitude $U_{E3}$ of the pulse E3 is greater than the amplitude $U_{E2}$ the corresponding measurement time $T_{M3}$ is too short. The same applies to the measurement time $T_{M4}$ which is obtained with the aid of the pulse E4 whose amplitude $U_{E4}$ is again greater than the amplitude $U_{E3}$.

The amplitude $U_{E5}$ of the pulse E5 is smaller than half the amplitude $U_{E4}$ of the pulse E4 and thus also smaller than the trigger level $U_{TrE5}$ set on the basis of the pulse E4. Consequently, the pulse E5 does not reach the associated trigger level. The same applies to the received pulse E6 whose amplitude is again smaller than half the amplitude $U_{E5}$ of the preceding received pulse E5. Thus, on receipt of the pulses E5 and E6 an excessively long measurement time is obtained which completely falsifies the result unless such pulses are suppressed by special circuit features.

FIG. 5 illustrates a further known measurement principle which is applied in particular when measuring very rapidly recurring periodic operations such as those present in infrared pulse radar technique. This is the known sampling method.

The sampling method, of course, consists in that from each of the periodically recurring processes a sample value is taken, the time location of the sample values being displaced slightly with respect to the start of the period from period to period. This sampling is controlled by sampling pulses whose period is greater by a fixed very small time difference than the period of the processes to be sampled. Each sample value is stored until the next sampling. The successive sample values thus give an image of the sampled processes but to a time scale expanded by a time transformation factor.

This is thus a sort of electronic stroboscopic sampling of periodic processes.

To explain the sampling method in diagram C of FIG. 5 signals of the same curve shape are shown which recur regularly with the period $T_S$. These signals are sampled by the sampling pulses A illustrated in the diagram B, the period $T_A$ of which differs by a small time difference $\Delta t$ from the period $T_S$ of the signals to be sampled. In the case of FIG. 5 the following equation applies:

$$T_A = T_S + \Delta t.$$

With the aid of the sampling pulses A of the diagram B from each of the successive signal curves of the diagram C a sample value is taken, the location of the sample values differing from one period to the next by the amount $\Delta t$.

If thus the first sample value coincides with the start of the signal period the second sample value lies at an interval $\Delta t$ after the start of the signal period, the third sample value $2\Delta t$ after the start of the signal period, etc.

It is pointed out that the time difference $\Delta t$ in FIG. 5 has been exaggerated for clarity; in reality this time difference is very small. It is for example 1/400000 of the period $T_S$ so that the successive sample values correspond to very closely adjacent points of the signal curve and a correspondingly high number (in the example given 400,000) of sample pulses is necessary for sampling a complete signal period.

The successively obtained sample values are stored until the next sample value giving the stepped curve illustrated in diagram D of FIG. 5 which reproduces one of the signal curves of diagram C on a greatly magnified time scale. Since in reality the number of sampling points is very large the stepped curve of diagram D is obtained with a very fine gradation which to a good approximation is a true image of a period of the curve of the diagram C.

The time magnification corresponds to the number of sample values used for a complete imaging of a signal period, i.e. in the numerical example given above 400,000:1. If the period duration of the time-transformed signal is designated by $T_S'$, then:

$$T_S' = k \cdot T_S.$$

The factor k is referred to as the time transformation factor.

The time-transformed signal obtained by the sampling and illustrated in diagram D of FIG. 5 can be evaluated in the same manner as the sampled signals if the time transformation factor is taken into account. However, because of the time magnification it is possible to work with circuits and apparatus operating much slower and in particular with a very much smaller band width.

The diagram A of FIG. 5 shows a known method for producing sampling pulses whose period differs by a constant time difference $\Delta t$ from a given period (in the present case the period $T_S$). For this purpose two linear sawtooth voltages $SZ_1$ and $SZ_2$ with very different rises are produced. The sawtooth voltage $SZ_1$ has the period $T_S$ of the signals to be sampled and the sawtooth voltage $SZ_2$ has a very much greater period. The two sawtooth voltages are applied to the input of a comparator which on detection of the coincidence of the rising edges initiates the production of a sampling pulse. The diagram A shows immediately that the coincidence instants in the successive periods of the sawtooth voltage $SZ_1$ each lie at an interval $\Delta t$, $2\Delta t$, $3\Delta t$ etc. after the start of the period. This corresponds exactly to the desired time location of the sampling pulses of the diagram B.

The sampling method described may also be used for the pulse spacing measurement between the transmitted pulses and received pulses in radar range measurement as illustrated in FIG. 6. The diagrams A and B of FIG. 6 correspond to the diagrams A and B of FIG. 5. The processes to be sampled illustrated in diagram C of FIG. 6 are however no longer signal curves extending over the entire duration of the period but the transmitted pulses S emitted with the period $T_S$ and the received pulses E of the radar range measuring method which arrive within each period, as illustrated in FIG. 1 for one period.

The sampling of the successive transmission periods of duration $T_S$ is done with the aid of the sampling pulses of diagram B in the manner previously described. Diagram D illustrates the time-magnified signal obtained by the sampling. It contains the image S' of the transmitted pulse S magnified by the time transformation factor and the image E' of the received pulses E magnified by the time transformation factor. The travel time $T_L$ between transmitted pulse and received pulse is also magnified by the time transformation factor as indicated at $T_L'$. The measurement of the spacing between transmitted pulse and received pulse explained with reference to FIGS. 1 to 4 can be made on the time-magnified pulses S', E', obtaining the magnified measurement time $T_M'$.

If for example a transmitted pulse period $T_S = 5$ μs (corresponding to a transmission recurrence frequency $f_S = 200$ kHz) is used and the time transformation factor assumed to be 400,000:1 as in the above example, the transmitted pulse period in the time-transformed range is $T_S' = 2$ s. If a range $D = 30$ m is measured this corresponds in the real time region to a pulse travel time $T_L = 2 \cdot 100$ ns. In the time-transformed region this gives a pulse travel time of $T_L' = 2 \cdot 40$ ms.

Thus, the pulse spacing can be measured on the time-transformed pulses S' and E' obtained by the sampling in very much simpler manner and with greater accuracy than in the real time region.

However, the sampling method has disadvantages as regards the effects outlined with the aid FIGS. 2, 3 and 4 of amplitude fluctuations of the received pulses on the trigger level setting. For the trigger level is set on the basis of the peak value of a time-transformed received pulse E' for the next time-transformed received pulse E'. Because of the time magnification in the numerical example given above the received pulses arrive substantially in the time interval of the time-transformed transmission period $T_S'$, i.e. in the time interval of 2 s. The probability that the amplitude of the received pulses varies considerably within this time-transformed interval is considerably greater than is the probability of an appreciable amplitude variation within a transmission period in the real time region.

Although for various reasons the use of the sampling method precisely in infrared pulse radar is very desirable and advantageous because of the short travel times and travel time differences, said use involves to a greater extent the problem of trigger level optimisation.

A method will be described hereinafter which whilst utilising the advantages of the sampling method permits optimum setting of the trigger level.

For this purpose a modified embodiment of the sampling method is employed and is illustrated in FIG. 7.

To facilitate understanding of the sampling principle employed, in diagram C of FIG. 7 the same signal to be sampled as in diagram C of FIG. 5 is illustrated. This signal again has the same period of $T_S$.

However, in this case the sampling is with the aid of sampling pulses A (diagram B of FIG. 7) whose recurrence period is smaller by a small interval $\Delta t$ than the period $T_S$ of the signal to be sampled. Thus, in this case the following relationship applies:

$$T_A = T_S - \Delta t$$

Consequently, in each period $T_S$ of the signal to be sampled the sampling instant is the time difference $\Delta t$ earlier than the sampling instant in the preceding period.

The time-transformed signal obtained by this sampling is shown in diagram D of FIG. 7. It is immediately apparent that this time-transformed signal truly represents a period of the sampled signal but is mirror inverted. To indicate this inversion of the time-transformed region the time scale is designated negative $(-t')$.

Diagram A of FIG. 7 shows a possibility for obtaining the sample pulses of diagram B. This is again done by producing a sampling pulse at the instant of coincidence of two sawtooth signals of very different period duration. The fast sawtooth signal $SZ_1$ again has the same period $T_S$ as the signal to be sampled and the same path with rising edges as in FIG. 5 and 6. The slow sawtooth signal $SZ_2$, on the other hand, has the reverse slope to that in FIG. 5 and 6. It is immediately apparent that the coincidence instants in successive periods of the sawtooth voltage $SZ_1$ lie respectively at an interval $\Delta t$, $2\Delta t$, $3\Delta t$, etc., before the end of the period. In this manner sampling pulses are obtained whose recurrence period $T_A$ is $\Delta t$ smaller than the period $T_S$ of the signals to be sampled.

Another possibility of generating sampling pulses whose period is smaller by a small time difference $\Delta t$ than the period of the signals to be sampled is illustrated in FIG. 8. The diagrams B, C, D of FIG. 8 correspond to the diagrams B, C and D of FIG. 7. In diagram A of FIG. 8 two sawtooth signals $SZ_1$ and $SZ_2$ are again illustrated which as in the case of FIG. 5 have edges rising in the same sense. However, in this case the period of the fast sawtooth $SZ_1$ is not equal to the period $T_S$ of the signals to be sampled but equal to the period $T_A$ of the sampling pulses; each sampling pulse is thus generated at the instant of the start of a rising edge of the fast sawtooth signal $SZ_1$. On the other hand, the coincidence instants between the fast sawtooth signal $SZ_1$ and the slow sawtooth signal $SZ_2$ each coincide with the start of a period of the signal of diagram C to be sampled. Thus, in this case the period $T_S$ of the signal to be sampled is $\Delta t$ greater than the period $T_A$ of the sampling pulses. This corresponds exactly to the time relationship given above:

$$T_A = T_S - \Delta t.$$

The method illustrated in FIG. 8 is particularly suitable for the case where the period of the signal to be sampled is not dependent on external conditions but can be defined by the measuring means. This applies for example in the case of radar range measurement in which the transmitted pulses can be initiated at any desired selectable instants.

FIG. 9 illustrates in a manner similar to FIG. 6 how the "time-reversed sampling method" explained with the aid of FIG. 7 affects the pulse space measurement in radar range measurement. The diagrams A and B of FIG. 9 correspond to the diagrams A and B of FIG. 7. In diagram C of FIG. 9 the same signals as in diagram C of FIG. 6 are illustrated, i.e. the pulses S transmitted with the transmission period $T_S$ and the received pulses E arriving within each period.

The diagram D shows the time-transformed signal obtained by the time-reversed sampling. It is apparent that not only the individual time-transformed pulses S' and E' are mirror inverted but the entire period so that in particular the mutual time locations of the pulses are reversed. The time-transformed received pulse E' thus appears before the time-transformed transmitted pulse S' and the leading edges of the real time region correspond to the trailing edges of the time-transformed pulses. Thus, to obtain the same conditions as in the case of FIG. 6 the time-transformed measurement time $T'_M$ must be measured at the trailing edges of the time-transformed pulses E' and S'.

The same result is of course obtained if the sampling pulses A are produced in the manner illustrated in FIG. 8.

It is immediately apparent from FIG. 9 that the information on the peak value of each pulse necessary for setting the trigger level is available before the trailing edge, which corresponds to the rising edge of the real time pulse and is used for the time measurement. It is therefore possible to set the trigger level for each pulse on the basis of the previously established peak value of the same pulse. This can be done with a very simple circuit and automatically gives the optimum trigger level for each pulse.

FIG. 10 shows an arrangement for carrying out the pulse spacing measurement explained utilising the "time-reversed sampling method" in an infrared pulse radar.

For clarity, the arrangement of FIG. 10 is divided into two sub-arrangements SEA and ZM by a dot-dash line and said sub-arrangements are connected together at the terminals K1, K2. The sub-arrangement SEA is the transmitting, receiving and sampling means which produces and transmits the infrared pulses, receives the echo pulses reflected at the target, generates the sampling pulses and samples the transmitted and received pulses by the time-reversed sampling method so that it furnishes at the terminal K1 the time-transformed transmitted pulses S' and at the terminal K2 the time-transformed received pulses E' of the diagram D of FIG. 9.

The sub-arrangement ZM is the time measuring means which measures the time interval $T_M'$ between the trailing edges of the time-transformed pulses E' and S'.

The transmission, receiving and sampling arrangement SEA includes an infrared pulse transmitter 10 which transmits periodic infrared pulses to a target whose range is to be measured and an infrared receiver 11 which receives the infrared pulses reflected at the target. The transmission of the pulses is sychronised by a clock means 12 which furnishes clock pulses with the desired transmission period $T_S$ which drive a transmitter control stage 13. The transmitter control stage 13 generates for each clock pulse an electrical trigger pulse which initiates the emission of an infrared pulse by the transmitter 10. Sychronously with each transmitted infrared pulse the transmitter 10 furnishes an electrical transmitted pulse S at an output connected to the signal input 14a of a sampling circuit 14. The output of the infrared receiver 11 furnishing the received pulses E is connected to the signal input 15a of a sampling circuit 15. The control inputs 14b, 15b of the sampling circuits 14, 15 are connected to the output of a sampling pulse generator 16.

The sampling circuits 14 and 15 are of the same type, for example of the sample and hold type, which whenever a short sampling pulse is applied to their control 14b, 15b make the charging voltage of a storage capacitor equal to the instantaneous value of a signal at the signal input 14a, 15a and hold said charge voltage until the next sampling pulse appears. The charge voltage of the storage capacitor is permanently available at the output 14c, 15c of each sampling circuit 14, 15.

The clock pulses furnished by the clock means 12, apart from being applied to the transmitter control stage 13, are also applied to the sychronising input of a fast sawtooth generator 17 and the input of a frequency divider 18. The output of the frequency divider 18 is connected to the sychronising input of a slow sawtooth generator 19 and the division factor of the frequency divider 18 is dimensioned according to the desired time transformation factor so that the period of the slow sawtooth generator 19 is very much greater than the period of the fast sawtooth generator 17. Furthermore, the sawtooth generators 17 and 19 are so constructed that their inclined edges are in opposition, i.e. the inclined edge of the slow sawtooth generator drops when the inclined edge of the fast sawtooth generator 17 rises. Thus, the output signals of the sawtooth generators 17 and 19 correspond to the sawtooth signals $SZ_1$ and $SZ_2$ illustrated in the diagram A of FIG. 9.

The output signals of the two sawtooth generators 17 and 19 are connected to the two inputs of a comparator 20 which is so constructed that it furnishes an output signal whenever the signals at its two inputs are of equal magnitude. The output of the comparator 20 is connected to a trigger input of the sampling pulse generator 16 so that the latter furnishes a sampling pulse A sychronously with each output signal of the comparator 20.

It is immediately apparent that the transmission, receiving and sampling means SEA gives the mode of operation explained with reference to FIG. 9 so that the sampling circuit 14 furnishes at its output 14c, which is connected to the terminal K1, the time-transformed transmitted pulses S' and the sampling circuit 15 furnishes at its output 15c, which is connected to the terminal K2, the time-transformed received pulses E'. These time-transformed pulses correspond to the diagram D of FIG. 9, i.e. their time location is reversed and each time-transformed received pulse E' appears before the associated time-transformed transmitted pulse S'.

In the time measuring means ZM the input of an amplifier 21 is connected to the terminal K1 and the output of said amplifier connected on the one hand to the signal input 22a of a threshold trigger 22 and on the other hand to the signal input 23a of a storing peak value detector 23. The threshold trigger 22 also has a trigger level input 22b and is so constructed that it furnishes a predetermined output signal at the output 22c whenever the signal at the input 22a drops below the trigger level at the trigger level input 22b; this output signal at the output 22c may for example correspond to the change of the output voltage from the value "0" to the value "1".

The storing peak value detector has a reset input 23b so that the stored voltage value can be reset to an initial value (which can also be zero) by applying a reset pulse R. This resetting takes place at the start of each sampling cycle; for this purpose as reset pulse R the output pulse of the frequency divider 18 may for example be used and initiates a new period of the slow sawtooth generator 19. The peak value detector 23 is so constructed that the voltage $U_{PS}$ furnished at its output 23c is equal to the voltage at the input 23a as long as the instantaneous value of said voltage is greater than any instantaneous value reached since the last resetting, whereas the output voltage $U_{PS}$ remains at the maximum value when the input voltage drops below a previously reached value. Thus, the output voltage $U_{PS}$ of the peak value detector 23 corresponds to the highest value of the input voltage reached during a sampling cycle.

Connected to the output 23c of the storing peak value detector 23 is a voltage divider 24 which consists for example of two resistors which are of equal magnitude in the example of embodiment described. The tap of the voltage divider 24 is connected to the trigger level input 22b of the threshold trigger 22. Thus, at the threshold trigger 22 half the output voltage $U_{PS}/2$ of the peak value detector 23 is applied as trigger level $U_{TrS}$.

Connected to the terminal K2 in the time measuring means ZM is a circuit arrangement which is completely identical to the circuit arrangement just described and connected to the terminal K1. Said circuit arrangement includes an amplifier 25 whose input is connected to the terminal K2 and to whose output are connected firstly the signal input 26a of a threshold trigger 26 and secondly the signal input 27a of a storing peak value detector 27. The threshold trigger 26 has a trigger level input 26b and furnishes at the output 26c a signal when its input voltage at the signal input 26a drops below the trigger level at the trigger level input 26b. The storing peak value detector 27 has a reset input 27b to which the reset pulses R are applied and furnishes at its output 27c a voltage $U_{PE}$ which is equal to the maximum value of the voltage at the signal input 27a reached since the last resetting. Connected to the output 27c of the detector 27 is a voltage divider 28 comprising two identical resistors, the tap of which is connected to the trigger level input 26b of the threshold trigger 26. Thus, at the trigger level input 26b half the output voltage $U_{PE}/2$ of the storing peak value detector 27 is applied as trigger level $U_{TrE}$.

The output 26c of the threshold trigger 26 is connected to the set input 29a of a bistable flip-flop 29 and the output 22c of the threshold trigger 22 is connected to the reset input 29b of the bistable flip-flop 29. The output 29c of the bistable flip-flop 29 is connected to the control input of a gate circuit 30 whose signal input is connected to the output of a counting pulse generator 31. The output of the gate circuit 30 is connected to the counting input of a counter 32 whose count can be transferred to a display means 33.

The mode of operation of the time measuring means ZM of FIG. 10 will be explained with the aid of the diagrams of FIG. 11.

In FIG. 11 in the time-transformed region $-t'$ two complete sampling cycles are represented which are each initiated by a reset pulse R as shown in diagram A of FIG. 11.

In each sampling cycle a time-transformed received pulse E'1, E'2 (diagram B) and a time-transformed transmitted pulse S'1, S'2 (diagram C) are obtained. As previously described, each time-transformed received pulse E' occurs in the respective sampling cycle earlier than the associated time-transformed transmitted pulse S'.

It is assumed as example that the time-transformed received pulse E'1 obtained in the first sampling cycle has an amplitude $U_{E'1}$ which is substantially greater than the amplitude $U_{E'2}$ of the time-transformed received pulse E'2 in the following sampling cycle. On the other hand, it may be assumed that the amplitudes $U_{S'1}$, $U_{S'2}$ of the transmitted pulses S'1, S'2 (diagram C) have the same magnitude.

Also illustrated in diagram B by the dashed line $U_{TrE}$ is the trigger level applied to the input 26b of the threshold trigger 26, which is equal to half the output voltage of the storing peak value detector 27. In the same manner, the dashed curve $U_{TrS}$ in diagram C represents the trigger level at the input 22b of the threshold trigger 22, which is equal to half the output voltage of the storing peak value detector 23.

The diagram D shows the gate pulses G which are furnished by the output 29c of the bistable flip-flop 29 and applied to the control input of the gate circuit 30.

The first measuring cycle starts at the instant $t'_{01}$ with a reset pulse R. This reset pulse clears the storing peak value detectors 23 and 27 so that the trigger level voltages $U_{PE}/2$ and $U_{PS}/2$ first have the value zero.

When during the sampling cycle the sampling of the real time received pulses begins the output voltage of the amplifier 25 representing the time-transformed received pulse E'1 rises and the output voltage $U_{PE}$ of the storing peak value detector 27 follows said rise in voltage until the peak value $U_{E'1}$ is reached. Consequently, the trigger level $U_{TrE}$ applied to the trigger level input 26b of the threshold trigger 26 also rises, said trigger level being equal at any time to half the instantaneous value of the voltage of the pulse E'1. It should be remembered that this rise takes place because of the sampling in reality in step form but the steps are so minute that they cannot be illustrated in FIG. 11.

When the voltage of the time-transformed pulse E'1 starts to fall again after reaching the peak value $U_{E'1}$ the trigger level voltage $U_{TrE}$ remains at the highest value $U_{E'1}/2$ reached. At the instant $-t'_{B1}$ the output voltage of the amplifier 25, which is applied to the signal input 26a of the threshold value trigger 26 and represents the time-transformed pulse E'1, reaches the value of the trigger level $U_{E'1}/2$ at the trigger level input 26b of the threshold trigger 26. At this instant the threshold trigger 26 thus furnishes at the output 26c a signal which causes the bistable flip-flop 29 to flip so that its output voltage at the output 29c changes from the value "0" to the value "1" (diagram D).

The same operations are repeated in identical manner in the circuits 21, 22, 23,24 during the sampling of the time-transformed transmitted pulse S'1. The trigger level $U_{TrS}$ at the trigger level input 22b of the threshold trigger 22 rises together with the output voltage of the amplifier 21 until the latter has reached its peak value $U_{S'1}$; when the output voltage of the amplifier 21 thereafter drops the trigger level remains at the maximum value $U_{S'1}/2$ reached. At the instant $-t'_{A1}$ there is again identity between the voltages at the inputs 22a and 22b of the threshold trigger 22 and consequently said threshold trigger 22 furnishes at the output 22c a signal which resets the bistable flip-flop 29. Between the instants $-t'_{B1}$ and $-t'_{A1}$ the bistable flip-flop has thus supplied a gate pulse G1 which has opened the gate circuit 30. For the duration of the gate pulse G1 the gate circuit 30 has allowed the counting pulses supplied by the counting pulse generator 31 to pass to the counter 32 so that the latter has reached a count which is proportional to the duration of the gate pulse G1. This count may be displayed in the display means 33 for indicating the time interval between the instants $-t'_{B1}$ and $-t'_{A1}$. This interval represents the desired measurement time $T'_{M1}$ in the time-transformed region.

At the end of the sampling of the time-transformed transmitted pulse S'1 a new measuring cycle is initiated by a reset pulse R. This returns the trigger level voltages $U_{TrE}$ and $U_{TrS}$ of the threshold triggers 26 and 22 respectively to zero again.

During the new sampling cycle the operations described above are repeated, the trigger level voltage at the threshold trigger 26 assuming a value $U_{E'2}/2$ which corresponds exactly to half the peak value $U_{E'2}$ of the time-transformed received pulse E'2, and the trigger level voltage at the threshold trigger 22 assumes a value $U_{S'2}/2$ which is exactly half the peak value $U_{S'2}$ of the time-transformed pulse S'2. The instant $-t'_{B2}$ of the start of the gate pulse G2 is thus again exactly at half the height of the trailing edge of the time-transformed received pulse E'2 and the instant $-t'_{A2}$ of the termination of the gate pulse G2 is exactly at half the height of the trailing edge of the time-transformed transmitted pulse S'2. The duration of the gate pulse G2 represents the measurement time $T'_{M2}$ in the second sampling cycle.

It is apparent from FIG. 11 that the instants $-t'_{B1}$ and $-t'_{B2}$ of the start of the time measurement always lie exactly at half the height of the trailing edge of the respective time-transformed received pulse E' even if these pulses have different amplitudes because the trigger level defining the initiation is fixed by the peak value of the same pulse and is independent of the amplitude of the preceding pulse.

The same applies to the completion of the measurement time at the instants $-t'_{A1}$, $-t'_{A2}$, which always coincides exactly with half the height of the trailing edges of the time-transformed transmitted pulses S'. Although in the case of the transmitted pulses, in contrast to the received pulses, it may be assumed that their peak values and thus the correct trigger levels do not substantially change with time, it is still advantageous to treat the transmitted pulses in the same manner as the received pulses. Firstly, this obviates the necessity of graduation of the arrangement when starting operation and secondly temporary fluctuations or extended changes in the transmitted pulse channel do not influence the measurement accuracy.

FIG. 12 shows a modified embodiment of the transmission, receiving and sampling means SEA which produces the sampling pulses A as explained with the aid of FIG. 8 whose period $T_A$ is smaller by the time difference $\Delta t$ than the recurrence frequency $T_S$ of the signals to be sampled. This means contains substantially the same components as the sub-arrangement SEA of FIG. 10, which are designated with the same reference numerals. There are only the following differences compared with the arrangement of FIG. 10.

The clock pulses produced by the clock means 12 are not applied to the transmitter control stage 13 but to the sampling pulse generator 16;

the slow sawtooth generator 19' is so constructed that the inclined edge of the slow sawtooth signal $SZ_2$ rises in the same sense as the inclined edge of the fast sawtooth signal $SZ_1$;

the output of the comparator 20 does not control the sampling pulse generator but the transmitter control stage 13 with interposition of a pulse shaper 34.

Accordingly, in the embodiment of FIG. 12 the sampling pulses A have the same period as the clock pulses emitted by the clock means 12 and the fast sawtooth signal $SZ_1$ whereas the infrared light pulses and the transmitted pulses S are produced at the instants which are defined by the establishment of coincidence between the two sawtooth signals $SZ_1$ and $SZ_2$ in the comparator 20.

It is immediately apparent that this mode of operation corresponds exactly to the representation in the diagrams of FIG. 8.

This modification has no effect on the formation of the time-transformed transmitted and received pulses S', E' because for the latter it is only important that the recurrence period $T_A$ of the sampling pulses A is smaller by the time difference $\Delta t$ than the recurrence period $T_S$ of the transmitted pulses S.

The measurement of the time-transformed interval $T_M'$ between the time-transformed received pulses E' and the time-transformed transmitted pulses S' obtained with the arrangement of FIG. 12 can thus be conducted in the same manner as with the arrangement of FIG. 10, for example with the aid of the time-measuring means $Z_M$ illustrated therein if the latter is connected to the terminals K1, K2 in FIG. 12.

In the arrangements previously described measurement errors are possible if in the time interval within the sampling cycle in which the received pulses are sampled real time received pulses E are not present or are received with greatly reduced amplitude. This will be explained with the aid of FIG. 13.

FIG. 13 shows in the time-transformed region $-t'$ the course of a sampling cycle similar to the illustration of FIG. 11. The diagram A of FIG. 13 shows a time-transformed received pulse E', the diagram B a time-transformed transmitted pulse S' and the diagram C the gate pulse G obtained at the output of the bistable flip-flop 29. Furthermore, in the diagrams A and B of FIG. 13 the trigger level voltages $U_{TrE}$ and $U_{TrS}$ are represented by dashed curves in the same manner as in FIG. 11.

If the time-transformed received pulse E' is obtained completely without gaps by sampling, the same conditions exist as in FIG. 11 and consequently the start of the gate pulse G is initiated at the instant $-t'_B$ which corresponds to half the height of the trailing edge of the time-transformed received pulse E'.

It is however assumed in diagram A of FIG. 13 that at an instant $-t'_C$ at which the voltage of the time-transformed received pulse E' has reached the value $U_C$ several real time received pulses are not present at all and consequently in these real time periods the voltage zero is sampled. This gives a temporary break in the time-transformed received pulse E' which then disappears again when the following real time received pulses are again received with full amplitude. At the start of the break at the instant $-t'_C$, however, the signal voltage at the input 26a of the threshold trigger 26 (FIG. 10) drops below the hitherto reached trigger level $U_C/2$ and as a result at the instant $-t'_C$ the threshold trigger 26 furnishes a signal to the set input of the bistable flip-flop 29 so that the gate pulse G starts already at the instant $-t'_C$ instead of at the instant $-t'_B$. It is obvious that this results in the measured time $T'_M$ being too great. The subsequent rising again of the voltage of the time-transformed received pulse E' and the repeated passage through the trigger level at the instant $-t'_B$ has no influence on the duration of the gate pulse G.

It is obvious that the measurement error explained with the aid of FIG. 13 occurs not only when the real time received pulses temporarily do not occur at all but also when the real time received pulses are received with an amplitude which is smaller than the hitherto reached trigger level.

FIG. 14 shows a modified embodiment of a part of the time measuring circuit ZM of FIG. 10 with which the danger of the measurement errors explained with the aid of FIG. 13 is obviated.

The circuit parts 30, 31, 32, 33 following the output of the bistable flip-flop 29 are omitted in FIG. 14 for simplicity; they may have the same form as in FIG. 10.

The part of the time-measuring means ZM shown in FIG. 14 differs from the embodiment of FIG. 10 only in the following respect:

The input amplifier 25' connected to the terminal K2 is constructed simultaneously as dynamic compressor whose gain is adjusted in dependence upon the instantaneous value of the input voltage so that the gain becomes smaller with increasing input voltage but remains constant with decreasing input voltage;

following the output of the amplifier and dynamic compressor 25' is an integrating circuit 35 which permits a drop of the output voltage of the amplifier and dynamic compressor 25' only with a predetermined time constant.

The effect achieved with these modifications will be explained with the aid of FIGS. 15 and 16.

FIG. 15 shows in very simplified form a time-transformed received pulse E' at the rising leading edge (corresponding to the rear edges of the real time received pulses E) of which the step curve is indicated which results from the sampling values taken from successive real time received pulses. The trailing edge of the received pulse E', which in reality is also formed by such a step curve, has a drop time which corresponds to the time-transformed rise time $T'_{RE}$ of the received pulses.

Furthermore, in FIG. 15 the trigger level voltage $U_{TrE}$ at the input 26b of the threshold trigger 26 is represented by a dot-dash line.

The time constant of the integrating circuit 35 is preferably so set that the negative slope of the drop of the output voltage of the amplifier 25' is made substantially equal to the negative slope of the trailing edge of the time-transformed received pulse E'.

It is assumed in FIG. 15 that at an instant $-t'_1$ at which the rising edge of the time-transformed received pulse E' has already reached a voltage value $U_{E1}$ a real time received pulse occurs with very greatly reduced amplitude so that a sampling value $U_{EX1}$ is taken from this real time received pulse which is substantially smaller than the trigger level $U_{E1}/2$ reached at the instant $-t'_1$. The output voltage of the amplifier 25' of FIG. 14 thus drops suddenly from the value $U_{E1}$ to the value $U_{EX1}$. On the other hand, the output voltage of the integrating circuit 35, because of the time constant set, can drop only with a negative slope which is defined by the line ST which extends substantially parallel to the trailing edge of the time-transformed received pulse E'. When the next received pulse again arrives with full amplitude the output voltage of the integrating circuit 35 has dropped temporarily only to a value $U_{f1}$ which is still substantially greater than the trigger level $U_{E1}/2$ obtaining at the respective instant and consequently no actuation of the bistable flip-flop 29 occurs.

It is apparent from FIG. 15 that even in the absence or reduced arrival of several successive received pulses the level does not fall below the trigger level $U_{E1}/2$ and consequently no erroneous initiation of the measurement takes place. The output voltage of the integrating circuit 35 dropping according to the line ST reaches the trigger level $U_{E1}/2$ only after an absence time $T'_{EX1}$ which is given by the following formula:

$$T_{EX1} = \frac{T_{RE}}{2} \cdot \frac{U_{E1}}{U_{E'}}$$

where $U_{E'}$, as illustrated in FIG. 15, is the peak amplitude of the time-transformed input pulse E'.

If a second absence of pulses starts at an instant $-t'_2$, at which the rising edge of the time-transformed received pulse E' has reached the voltage value $U_{E2}$, and the trigger level has thus reached the value $U_{E2}/2$, a permissible absence time results of $T'_{EX2}$, which is greater than the permissible absence time $T'_{EX1}$, which starts at the instant $T'_{EX1}$, which starts at the instant $-t'_1$. It is apparent therefrom that the admissible absence time $T'_{EX}$ is smaller the smaller the voltage of the time-transformed received pulse E' reached before the absence instant. Thus, in particular at the start of the sampling of the received pulses the permissible absence times are small.

To reduce the influence of absent or greatly weakened echo pulses in this initial region as well the input amplifier 25' is constructed as dynamic compressor but the gain thereof is not adjusted, as in conventional dynamic compressors, to the level of the input signal in the rising and falling direction but is reduced with increasing level of the input signal, retaining however the value last reached when the level of the input signal falls so that the gain is not changed for the dropping edge of the amplified pulses.

The effect achieved thereby will be explained with the aid of FIG. 16. The diagram of FIG. 16 shows the output signal of the amplifier 25' constructed as dynamic compressor when it is assumed for simplification that the gain is switched between two values. Until a voltage value $U_G$ is reached the amplifier 25' has a high gain so that the edge of the time-transformed received pulse E' rises steeply. When the voltage $U_G$ is reached the gain is switched to a smaller value so that the rise is now more gradual. The trigger level voltage $U_{T'E}$ follows the course of the rising edge with the constant ratio 1:2. Since during the dropping trailing edge of the time-transformed received pulse E' the gain remains constant, the initiation of the time measurement again takes place at the correct instant at half the height of the trailing edge. The time measurement is thus not impaired by the dynamic compression. On the other hand, it is apparent that in the initial region of the time-transformed received pulse E' relatively large voltages are reached very quickly which results in correspondingly greater permissible absence times $T'_{EX}$ as has been explained with the aid of FIG. 15.

FIG. 17 shows a modified embodiment of the time-measuring means ZM of FIG. 10 with which rereflections which inevitably occur in measuring methods based on the echo principle are suppressed. Such rereflections occur because of the time reversal in the time-transformed signal before the received pulse valid for the measurement, which in the real time signal is the first received pulse and thus in the reversed time-transformed signal the last received pulse.

The circuit parts designated in FIG. 17 with the same reference numerals as in FIG. 10 have the same structure and function and will therefore not be described again.

However, there are the following differences compared with the embodiment of FIG. 10:

The set input 29a of the bistable flip-flop 29 is connected to the output 22c of the threshold trigger 22. The resetting of the bistable flip-flop 29 is by an up/down counter 37 which receives at its counting pulse input 37a the pulses furnished by a counting pulse generator 39 via a gate circuit 38. The up/down counter has a control input 37b which is connected to the output 22c of the threshold trigger 22 and serves to change from up counting to down counting. The up/down counter 37 counts up when the signal at the control input 37b has reached the value "0" whereas it counts down when said signal has the value "1". The up/down counter 37 furnishes at an output 37c a pulse when it reaches the count zero during the down counting; said output 37c is connected to the reset input 29b of the flip-flop 29. Finally, the up/down counter 37 has a reset input 37d which is connected to the output 26c of the threshold trigger 26. The count of the up/down counter 37 is reset to the value zero when the signal applied to the reset input 37d passes from "1" to "0". Finally, the control input of the gate circuit 38 is also connected to the output 26c of the threshold trigger 26.

It is apparent that the circuit parts 37, 38, 39 form a time measuring means of the same type as the circuit parts 30, 31, 32.

As will be explained hereinafter the reset pulses R' applied to the reset inputs of the storing peak value detectors 23 and 27 have a different time location to the reset pulses R in FIGS. 10 and 11; in addition, at least the peak value detector 27 is constructed so that the stored voltage is not returned to zero by the reset pulse R' but to an initial value different from zero.

The mode of operation of the arrangement of FIG. 17 will be explained with the aid of the diagrams of FIG. 18.

The diagrams of FIG. 18 show different signals which occur in the time measuring means of FIG. 17 in the course of a sampling cycle. All the diagrams are represented in the reversed time-transformed region $-t'$.

The diagram A shows the time-transformed received pulses E' appearing at the output of the amplifier 25 and applied to the signal input 26a of the threshold trigger 26 and, in dash line, the trigger level $U_{TrE}$ at the trigger level input 26b of the threshold trigger 26. In addition to the received pulse E' which corresponds to the first reflection and is valid for the time measurement, the received pulse E'r corresponding to the first rereflection is illustrated. Since the received pulses corresponding to the rereflections occur in the real time region after the first echo pulse the corresponding time-transformed received pulses appear in the reversed time-transformed region before the received pulse E' to be detected. In accordance with the actual conditions, it is further assumed that the received pulse E'r has a substantially smaller amplitude than the received pulse E'. Further time-transformed received pulses may also be present corresponding to rereflections of a higher order; they would lie before the received pulse E'r and have still smaller amplitudes.

The diagram B shows the voltage at the output 26c of the threshold trigger 26.

The diagram C shows the time-transformed transmitted pulse S' which appears at the output of the amplifier 21 and is applied to the signal input 22a of the threshold trigger 22 and, in a dashed line, the trigger level $U_{TrS}$ which is at the trigger level input 22b of the threshold trigger 22. The diagram D shows the output voltage at the output 22c of the threshold trigger 22.

In the diagram E the counting pulses allowed to pass by the gate circuit 38 to the counting pulse input 37a of the up/-down counter 37 are shown.

The diagram F represents the gate pulse G appearing at the output 29c of the bistable flip-flop 29.

Finally, in the diagram G the reset pulses R' are shown which each initiate the start of a new measuring cycle.

At the start of the measuring cycle illustrated at the instant $-t'_0$ the peak values stored in the peak value detectors 23 and 27 and consequently also the trigger levels $U_{TrE}$ and $U_{TrS}$ are reset by the reset pulse R' to the initial value. The output signal of the threshold trigger 26 is brought to the value "1" (diagram B), thus opening the gate circuit 38 for the passage of counting pulses to the up/down counter 37 (diagram E). The output signal of the threshold trigger 22 (diagram D) is brought to the value "0" so that the up/down counter 37 is set to forward counting. Thus, the counting pulses passed by the gate circuit 38 are counted upwards in the up/down counter 37.

At the instant $-t'_1$ the rising edge of the received pulses E'r exceeds the set trigger level $U_{TrE}$. As a result the output signal of the threshold trigger 26 becomes "0". This blocks the gate circuit 38 and simultaneously resets the up/down counter 37 to zero. The voltage of the received pulse E'r rises to the peak value $U_{E'r}$ and thus the trigger level $U_{TrE}$ simultaneously reaches the value $U_{E'r}/2$.

At the instant $-t'_2$ coincidence exists between the dropping edge of the received pulse E'r and the trigger level $U_{E'r}/2$. As a result the output voltage of the threshold detector 26 returns to "1" and the gate circuit 38 is thus reopened. The counting pulses passed are again counted upwards in the up/down counter 37. The trigger level with the value $U_{E'r}/2$ last reached remains at the input 26b of the threshold trigger 26.

At the instant $-t'_3$ the rising edge of the received pulse E' reaches the trigger level last set so that the output voltage of the threshold trigger 26 again returns to "0", the gate circuit 38 is blocked and the up/down counter 37 is returned to zero.

Thereafter, the voltage of the received pulse E' rises to the peak value $U_{E'}$ and concurrently therewith the trigger level $U_{TrE}$ attains the value $U_{E'}/2$.

If at the instant $-t'_4$ coincidence exists between the dropping edge of the received pulse E' and the trigger level $U_{E'}/2$ reached the output voltage of the threshold trigger 26 again becomes "1". The gate circuit 38 is reopened and the up/down counter 37 again starts counting the counting pulses upwards from the count zero onwards.

Since the received pulse E' is the received pulse valid for the time measurement, the instant $-t'_4$ corresponds at the same time to the instant $-t'_B$ of the start of the actual time-transformed measurement time $T'_M$. This measurement time terminates at the instant $-t'_5$ at which the dropping edge of the transmitted pulse S' is coincident with the trigger level $U_{TrS}$ which has reached at this time the value $U_{S'}/2$ which is equal to half the peak value $U'_{S'}$ of the time-transformed transmitted pulse S'. Thus, the time $-t'_5$ corresponds to the end instant $-t'_A$ of the actual time-transformed measurement time $T'_M$.

At the instant $-t'_5$ the output voltage at the output 22c of the threshold trigger 22 (diagram D) becomes "1", the up/down counter 31 thus being switched to down counting. At the same time, the rising pulse edge appearing at the input 29a of the bistable flip-flop 29 causes the bistable flip-flop to flip so that the output signal at the output 29c becomes "1". This corresponds to the start of the gate pulse G (diagram F).

Since the output signal of the threshold trigger 26 retains the value "1" the gate remains open so that further counting pulses are supplied to the counting pulse input 37a of the up/down counter 37 but are now counted downwards. The count of the up/down counter 37 becomes smaller until the count zero is reached at the instant $-t'_6$. At this instant, at the output 37c a signal appears which is applied to the reset input 29b of the bistable flip-flop 29 and resets the bistable flip-flop to the initial condition. This terminates the gate pulse G at the output 29c.

It is immediately apparent that the number of counting pulses counted between the instants $-t'_5$ and $-t'_6$ corresponds exactly to the number of counting pulses counted upwards between the instants $-t'_4$ and $-t'_5$. The time interval between the instants $-t'_5$ and $-t'_6$ is thus exactly equal to the time interval between the instants $-t'_4$ and $-t'_5$, i.e. exactly equal to the time-transformed measurement time $T'_M$. Thus, in this case as well, the duration of the gate pulse G is equal to the desired measurement time $T'_M$ which is measured by the circuits 30, 31, 32, 33 in the manner previously explained and displayed.

At the instant $-t'_7$ a new reset pulse R' appears and initiates the next measuring cycle. It must however be remembered that in contrast to the mode of operation explained with reference to FIG. 11 this reset pulse R' must not coincide directly with the end of the time-transformed transmitted pulse S' but should appear at a time interval which is at least equal to the maximum time-transformed measurement time $T'_M$ occurring.

As apparent from the above description, the circuit of FIG. 17 has the effect that only the last time-transformed received pulse E', which appears before the time-transformed transmitted pulse S', is utilised for the time measurement whilst the time measurement initiated by any earlier received pulse E'r due to rereflection is cancelled again by the next time-transformed received pulse arriving. In this manner the received pulses due to rereflection are suppressed.

The circuits described may be modified in many respects. For example, instead of the linear sawtooth signals exponentially rising sawtooth signals may be used or instead of a linear slow sawtooth signal a sawtooth signal rising in step manner.

It is also possible with the arrangement of FIG. 10 to use the same sampling circuit for sampling the transmitted pulses and the received pulses so that the time-measuring means contains only one threshold trigger and only one storing peak value detector; in this case, it is only necessary to ensure that the time measurement in each measuring cycle is started in each case by the first output signal of the threshold trigger and stopped by the second output signal. The method described is particularly suitable for this simplification because the trigger level is reset for each pulse. Finally, the time measurement may also be conducted in any other suitable manner instead of by pulse counting.

I claim:

1. Method for pulse spacing measurement with periodic pulse pairs, in particular in pulse radar, by measuring the time interval between the instants of the coincidence of a pulse edge with a trigger level which is set in a predetermined ratio to the peak value of the pulse, characterised in that the pulse pairs are sampled by the sampling method with the aid of sampling pulses whose recurrence period is smaller by a predetermined small time difference than the recurrence period of the pulse pairs, that for each time-transformed pulse obtained by the sampling the peak value is determined and a trigger level having a predetermined ratio to the peak value is set, and that the time interval between the instants of the coincidence of the trailing phase edge of each time-transformed pulse and the associated trigger level is measured.

2. Method according to claim 1, characterised in that the trigger level is set to half the peak value.

3. Method according to claim 1 or 2, characterised in that the sampling pulses are produced at the instants of the coincidence of the rising edges of a fast sawtooth signal, whose period is equal to the recurrence periods of the pulse pairs, with the falling edge of a slow sawtooth signal varying in the opposite sense.

4. Method according to claim 1 or 2, characterised in that the recurrence periods of the pulse pairs are initiated by sychronising pulses which are produced at the instants of the coincidence of the rising edges of a fast sawtooth signal, whose peak period is equal to the recurrence period of the sampling pulses, with the rising edge of a slow sawtooth signal varying in the same sense.

5. Apparatus for carrying out the method according to claims 1 or 2 comprising at least one sampling circuit which is controlled by the sampling pulses and furnishes the time-transformed pulses at the output, characterised in that the output (14c, 15c) of each sampling circuit (14, 15) is connected to the signal input (22a, 26a) of a threshold trigger (22, 26) which furnishes at the output (22c, 26c) a signal when the trailing edge of its input signal is in coincidence with the trigger level ($U_{TrS}$, $U_{TrE}$) which is applied to a trigger level input (22b, 26b), that the output (14c, 15c) of each sampling circuit (14, 15) is also connected to the signal input (23a, 27a) of a storing peak value detector (23, 27) which furnishes at the output (23c, 27c) a signal ($U_{PS}$, $U_{PE}$) which is resettable at the start of each measuring cycle to an initial value and thereafter corresponds to the maximum value of its input signal reached since the last resetting, that a signal ($U_{TrS}$, $U_{TrE}$) is a predetermined ratio to the output signal of the peak value detector is applied to the trigger level input (22b, 26b) of the threshold trigger (22, 26), and that a time measuring means (30, 31, 32, 33) is provided for measuring the interval ($T'_M$) between the output signal of a threshold trigger (26) corresponding to the one time-transformed pulse (E') of each pulse pair (E', S') and the output signal of a threshold trigger (22) corresponding to the other time-transformed pulse (S') of each pulse pair (E', S').

6. Apparatus according to claim 5, characterised in that for the two pulses (S, E) of each pulse pair separate circuit channels are provided each having a sampling circuit (14, 15), a threshold trigger (22, 26) and a storing peak value detector (23, 27).

7. Apparatus according to claim 6, characterised in that the output signal of the threshold trigger (26) contained in a circuit channel sets the time measuring means (30, 31, 32, 33) in operation and the output signal of the threshold trigger (22) contained in the other circuit channel stops the time measuring means.

8. Apparatus according to claim 6 or 7, characterised in that the pulses applied to the first circuit channel (14, 22, 23) are the transmitted pulses (S) and the pulses applied to the second circuit channel (15, 26, 27) are the received pulses (E) of a pulse radar system.

9. Apparatus according to claim 8, characterised in that in the second circuit channel of the sampling circuit (15) an integrating circuit (35) is connected which limits the drop of its output signal to a predetermined negative slope.

10. Apparatus according to claim 9, characterised in that the time constant of the integrating circuit (35) is set so that the negative slope is substantially equal to the negative slope of the trailing edges of the time-transformed received pulses (E').

11. Apparatus according to claim 9 or 10, characterised in that in the second circuit channel an amplifier (25') constructed as dynamic compressor is disposed whose gain becomes smaller with increasing magnitude of the input signal but remains constant with decreasing magnitude of the input signal.

12. Apparatus according to claim 8, characterised in that to the output of the threshold trigger (26) of the second circuit channel (15, 26, 27) an auxiliary time measuring means (37, 38, 39) is connected in such a manner that it is set in operation by the coincidence of the trailing edge of each time-transformed received pulse (E'r, E') with the trigger level ($U_{TrE}$) and is cleared by the coincidence of the leading edge of each following time-transformed received pulse (E'r, E'), and that the output signal of the threshold trigger (22) of the first circuit channel terminates the time measurement in the auxiliary time measuring means (37, 38, 39) and initiates the transfer of the measured value reached.

13. Apparatus according to claim 12, characterised in that the auxiliary time measuring means contains an up/down counter (37) which receives counting pulses from a counting pulse generator (39) via a gate circuit (38) controlled by the output signal of the threshold trigger (26) of the first circuit channel and has a reset input (37d) controlled by said output signal, that a control input (37b) of the up/down counter (37) is connected to the output (22c) of the threshold trigger (22) of the first circuit channel in such a manner that it is reversible by the output signal thereof from up counting to down counting, that the output signal of the threshold trigger (22) of the first circuit channel sets the time measuring means (30, 31, 32, 33) used for the time spacing measurement in operation, and that the up/down counter (37) on reaching the count zero during downward counting furnishes a signal which stops the time measuring means (30, 31, 32, 33) used for the pulse spacing measurement.

* * * * *